United States Patent
Huang et al.

(10) Patent No.: US 11,460,786 B2
(45) Date of Patent: Oct. 4, 2022

(54) POSITIONING SYSTEM AND A METHOD FOR POSITIONING A SUBSTAGE OR A STAGE WITH RESPECT TO A FRAME

(71) Applicant: ASML Netherlands B.V., Veldhoven (NL)

(72) Inventors: Yang-Shan Huang, Veldhoven (NL); Petrus Theodorus Rutgers, Hengelo (NL)

(73) Assignee: ASML Netherlands B.V., Veldhoven (NL)

( * ) Notice: Subject to any disclaimer, the term of this patent is extended or adjusted under 35 U.S.C. 154(b) by 112 days.

(21) Appl. No.: 16/763,925

(22) PCT Filed: Oct. 18, 2018

(86) PCT No.: PCT/EP2018/078579
§ 371 (c)(1),
(2) Date: May 13, 2020

(87) PCT Pub. No.: WO2019/096536
PCT Pub. Date: May 23, 2019

(65) Prior Publication Data
US 2021/0373446 A1 Dec. 2, 2021

(30) Foreign Application Priority Data
Nov. 15, 2017 (EP) .................... 17201865

(51) Int. Cl.
*G03F 7/20* (2006.01)
*H02K 21/44* (2006.01)
*H02K 41/03* (2006.01)

(52) U.S. Cl.
CPC ...... *G03F 7/70775* (2013.01); *G03F 7/70725* (2013.01); *G03F 7/70758* (2013.01); *H02K 21/44* (2013.01); *H02K 41/033* (2013.01)

(58) Field of Classification Search
CPC ............ G03F 7/70775; G03F 7/70758; G03F 7/70725; H02K 21/44; H02K 41/033
(Continued)

(56) References Cited

U.S. PATENT DOCUMENTS 6,927,838 B2 * 8/2005 Ono .................... G03F 7/70725
318/560
8,284,379 B2 * 10/2012 Phillips ................... G03F 7/707
355/75

(Continued)

FOREIGN PATENT DOCUMENTS

EP 1 944 650 A2 7/2008

OTHER PUBLICATIONS

International Search Report and Written Opinion of the International Searching Authority directed to related International Patent Application No. PCT/EP2018/078579, dated Jan. 28, 2019; 11 pages.

(Continued)

*Primary Examiner* — Hung V Nguyen
(74) *Attorney, Agent, or Firm* — Sterne, Kessler, Goldstein & Fox P.L.L.C.

(57) ABSTRACT

A method for positioning a substage (9), supported by a main stage (5), relative to a reference object, the substage moveable in a direction (7) between a first and second position relative to the main stage. The method includes positioning the first stage using a passive force system that is activated by positioning the main stage. The passive force system includes two magnet systems (119, 121), each magnet system being configured to apply a force in the direction to the first stage with respect to the second stage in a non-contact manner, the forces resulting in a resultant force applied to the first stage in the direction by the passive force system. A magnitude and/or a direction of the resultant force (Continued)

depends on the position of the first stage relative to the second stage, and the first stage has a zero-force position between the first and second position in which the resultant force is zero.

20 Claims, 15 Drawing Sheets

(58) Field of Classification Search
USPC .................................................. 355/72–76
See application file for complete search history.

(56) References Cited

U.S. PATENT DOCUMENTS

| | | | |
|---|---|---|---|
| 8,896,811 B2* | 11/2014 | Hol | .................... G03F 7/70758 |
| | | | 355/72 |
| 2005/0002008 A1 | 1/2005 | De Weerdt et al. | |
| 2005/0200826 A1 | 9/2005 | Schmidt | |
| 2008/0067968 A1* | 3/2008 | Binnard | ................ H02P 25/064 |
| | | | 318/135 |
| 2011/0075122 A1 | 3/2011 | Hol et al. | |

OTHER PUBLICATIONS

International Preliminary Report on Patentability directed to related International Patent Application No. PCT/EP2018/078579, dated May 19, 2020; 8 pages.

\* cited by examiner

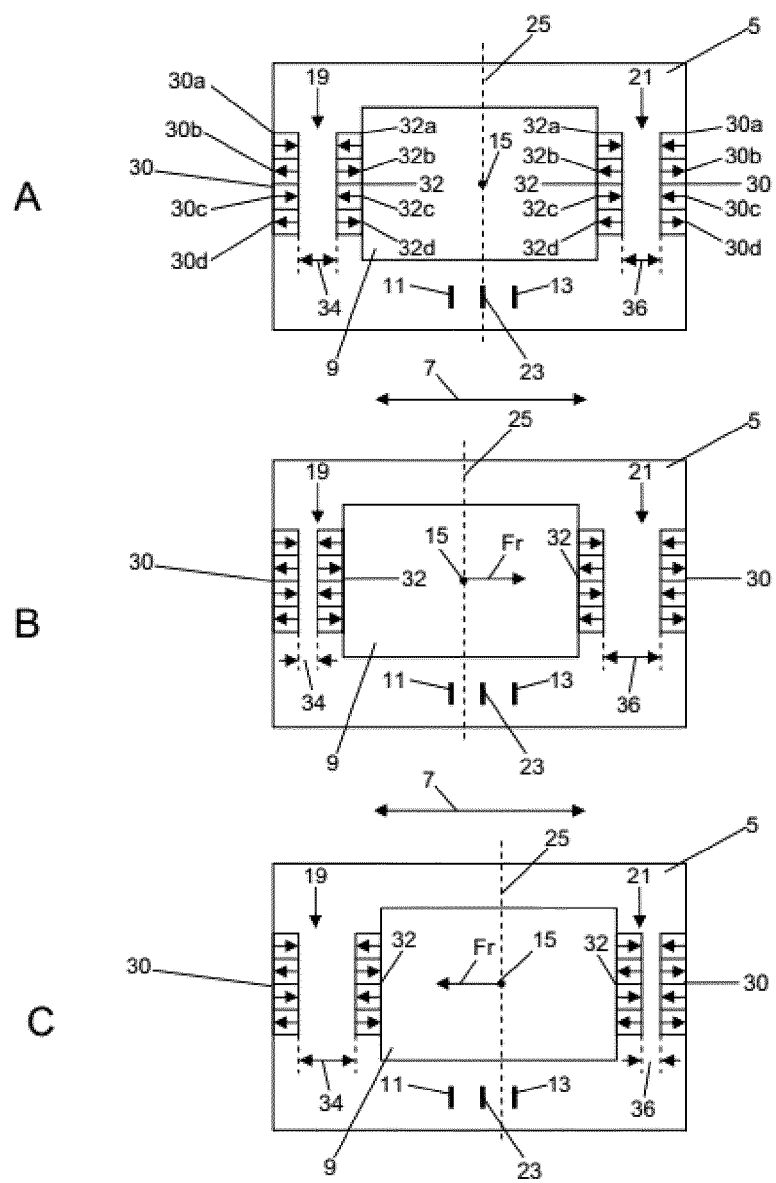

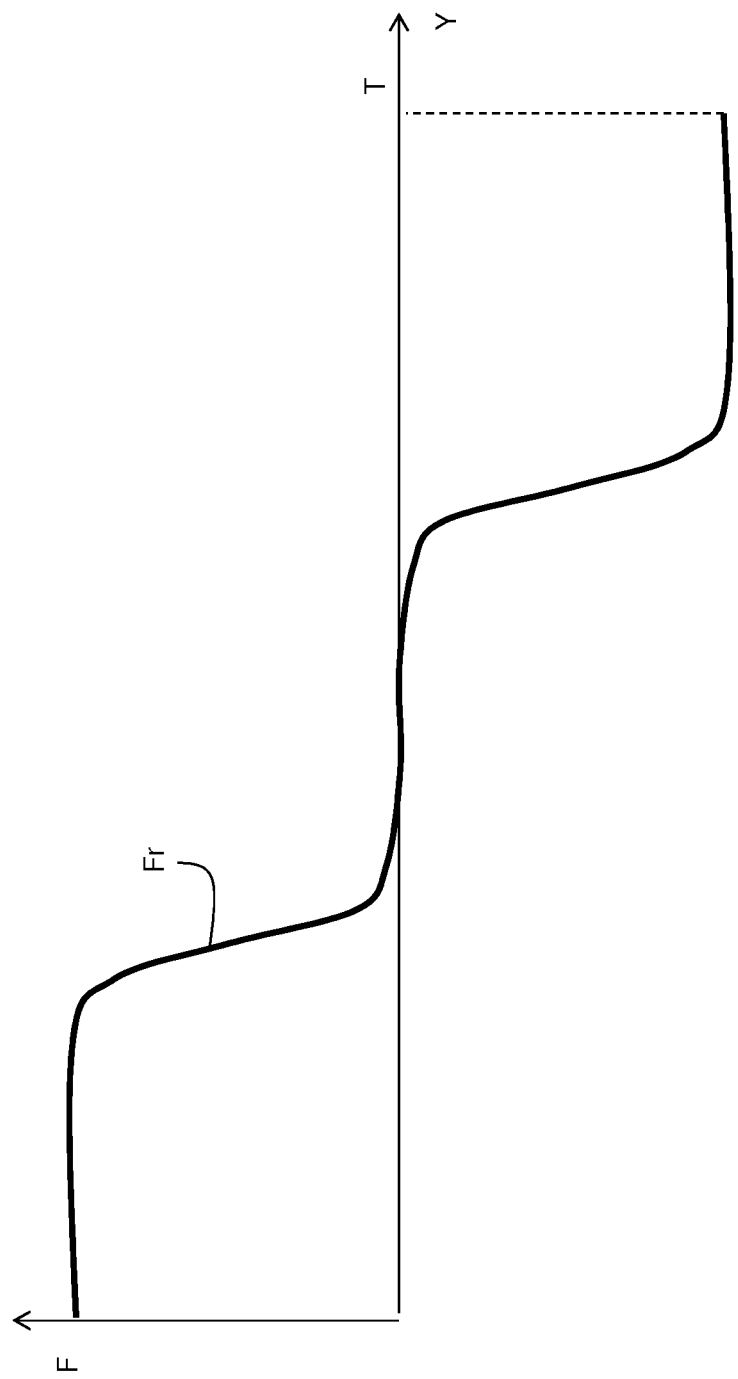

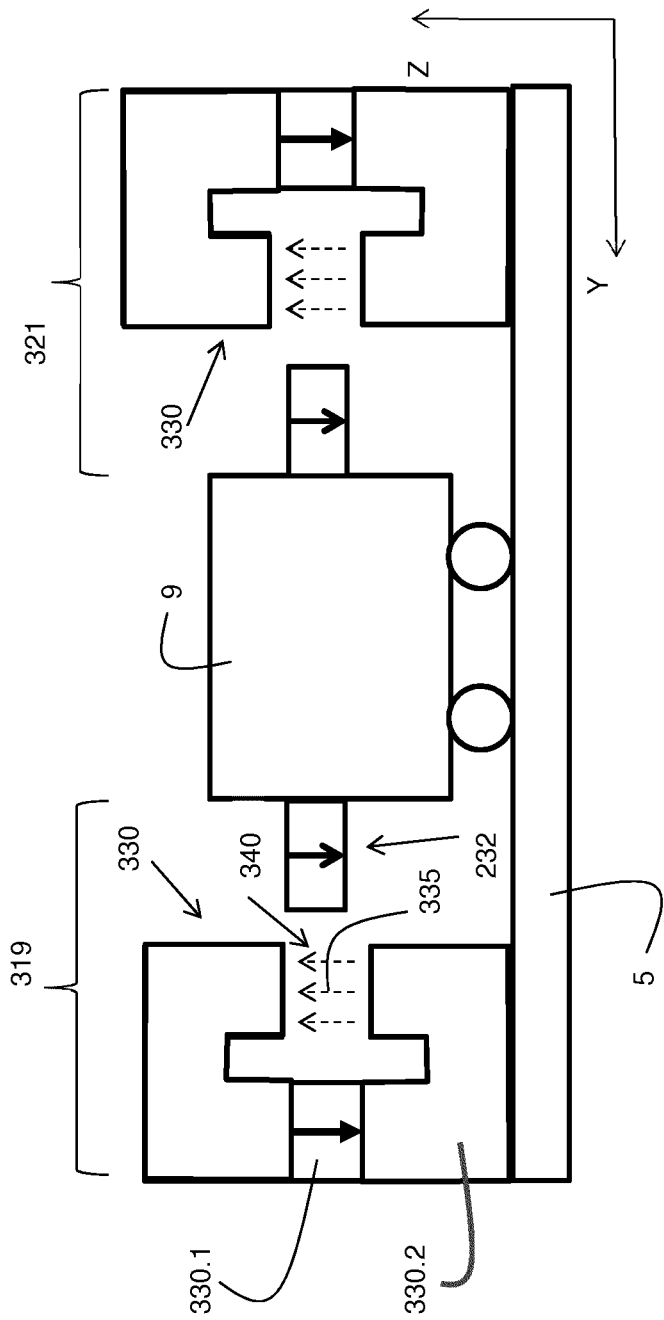

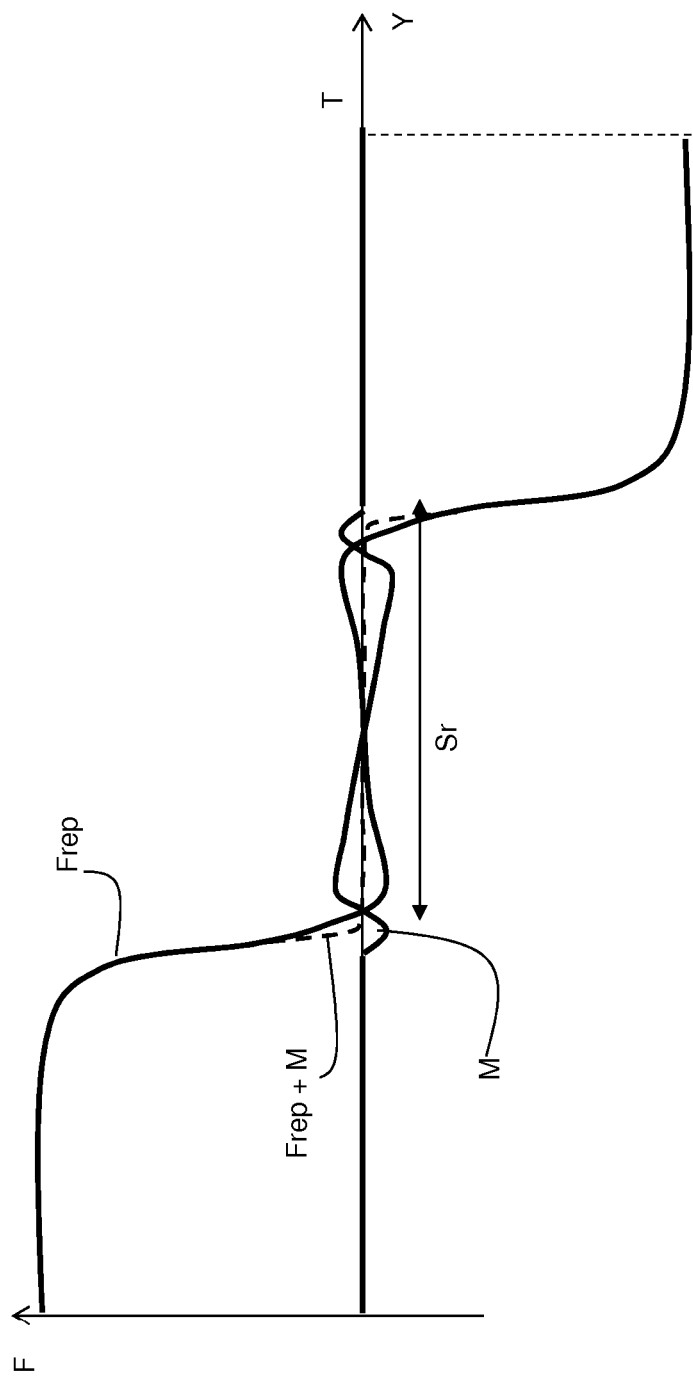

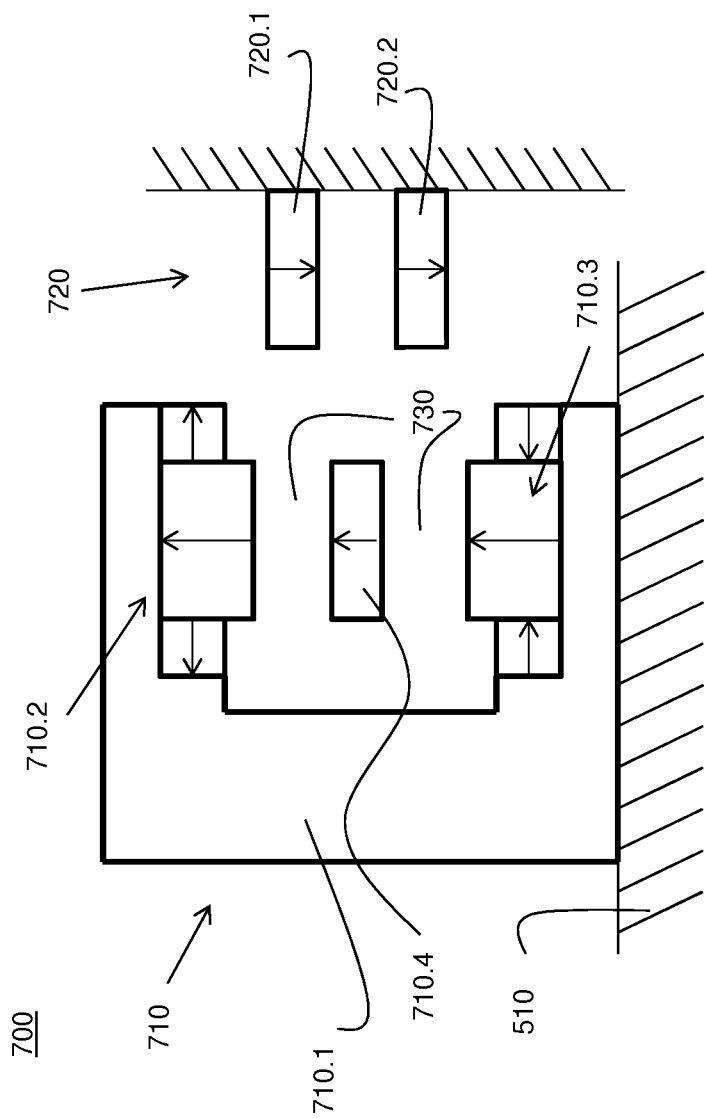

POSITIONING SYSTEM AND A METHOD FOR POSITIONING A SUBSTAGE OR A STAGE WITH RESPECT TO A FRAME

CROSS-REFERENCE TO RELATED APPLICATIONS

This application claims priority of EP application 17201865.7 which was filed on Nov. 15, 2017 and which is incorporated herein in its entirety by reference.

FIELD

The present invention relates to a positioning system, in particular for a lithographic apparatus, and a method for positioning a substage or a stage with respect to a frame.

BACKGROUND

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

A lithographic apparatus may include a positioning system to position a moveable object, such as a substage with respect to a reference object, e.g. a metrology frame or a main frame. The substage may be or include a support structure to hold the substrate or patterning device.

Usually, the positioning system includes a main stage which is moveable with respect to a frame in a moving direction, wherein the substage is moveable in the moving direction between a first and a second position relative to the main stage. The substage may be supported by the main stage. Generally, a long stroke actuator is provided between the frame and the main stage as a first actuator to apply a force to the main stage with respect to the frame in the moving direction, and a short stroke actuator is provided between the main stage and the substage as a second actuator to apply a force to the substage with respect to the main stage in the moving direction. The long stroke actuator is used for coarse positioning of the main stage and substage, and the short stroke actuator is used for fine positioning of the substage relative to the main stage. The short stroke actuator may be a moving magnet system in which the stator, i.e. a part of the main stage, includes a coil system which is surrounded by a mover, i.e. a part of the substage, which includes magnets incorporated in magnetically highly permeable metal in order to achieve high magnetic field densities.

With this configuration, when the long stroke actuator accelerates the main stage with a certain acceleration, the short stroke actuator also has to apply a force between the substage and the main stage to accelerate the substage with the same amount. The force to accelerate the substage is in fact generated twice, once by the long stroke actuator and once by the short stroke actuator. As a consequence, the short stroke actuator is designed in accordance with these demands, resulting in a relatively large and heavy short stroke actuator and thus a relatively high mass of the substage, so that an even larger force has to be generated to accelerate the substage. Also, when the substage is accelerated with a certain amount, a lot of heat is generated by the short stroke actuator in or near the substage which causes structural deformations resulting in e.g. a loss of position measurement accuracy and deformation of the patterning device or substrate on top of the substage.

To cool the substage, hoses carrying a cooling fluid may be provided between the substage and the main stage or frame, thereby introducing force disturbances that limit the position accuracy of the positioning system.

It can further be noted that similar cooling and force issues can be identified with respect to driving the main stage. In particular, in known arrangements, comparatively large, powerful linear motors are typically used to drive a main stage in a lithographic apparatus, these motors requiring intensive cooling.

SUMMARY

It is desirable to provide an improved positioning system.

According to an embodiment of the invention, there is provided a method to position a substage with respect to a reference object with:
  a main stage which is moveable with respect to a frame in a moving direction, the substage being moveable in the moving direction between a first and a second position relative to the main stage;
  a main actuator between the main stage and the frame for applying a force to the main stage with respect to the frame in the moving direction; and
  a passive force system between the substage and the main stage, including at least two magnet systems, each magnet system being configured to apply a force in the moving direction to the substage with respect to the main stage in a non-contact manner, the forces resulting in a resultant force applied to the substage in the moving direction by the passive force system,
  wherein a magnitude and/or a direction of the resultant force depends on the position of the substage relative to the main stage, and wherein the substage has a zero-force position between the first and second position in which the resultant force has a zero magnitude,
  and wherein the substage is positioned with respect to the reference object in or near a desired position with the passive force system by positioning the main stage relative to the frame with the main actuator.

According to another embodiment of the invention, there is provided a positioning system including:
  a main stage which is moveable with respect to a frame in a moving direction;
  a substage which is moveable in the moving direction between a first and a second position relative to the main stage;

a main actuator to apply a force to the main stage with respect to the frame in the moving direction;
a passive force system between the substage and the main stage, including at least two magnet systems, each magnet system being configured to apply a force in the moving direction to the substage with respect to the main stage in a non-contact manner, the forces resulting in a resultant force applied to the substage in the moving direction by the passive force system,
wherein a magnitude and/or a direction of the resultant force depends on the position of the substage relative to the main stage;
and wherein the substage has a zero-force position between the first and second position in which the resultant force has a zero magnitude, the positioning system further including:
a control system configured to position the substage with respect to a reference object in or near a desired position with the passive force system by positioning the main stage relative to the frame with the main actuator.

According to a second aspect of the invention, there is provided a positioning system comprising:
a frame;
a stage being movable with respect to the frame in a moving direction between a first position and a second position;
a magnetic force system configured to drive the stage in the moving direction, the magnetic force system comprising at least two magnet systems, each magnet system being configured to apply a repelling force in the moving direction to the stage in a non-contact manner; the repelling forces resulting in a resultant force applied by the magnetic force system to the stage in the moving direction;
wherein a magnitude and/or a direction of the resultant force depends on the position of the stage relative to the frame, and wherein the stage has a zero-force position between the first and second position in which the resultant force has a zero magnitude;
whereby each magnet system comprising:
a first magnet assembly mounted to one of the stage and the frame and;
a second magnet assembly mounted to the other one of the stage and the frame;
wherein the first magnet assembly comprises a first magnet and the second magnet assembly comprises a magnetic circuit having a gap, the gap of the magnetic circuit is configured to at least partially receive, during use, the first magnet;
wherein the second magnet assembly is configured to generate a magnetic flux that crosses said gap, and wherein the positioning system further comprises an electromagnetic motor or actuator configured to drive the stage in the moving direction relative to the frame.

BRIEF DESCRIPTION OF THE DRAWINGS

Embodiments of the invention will now be described, by way of example only, with reference to the accompanying schematic drawings in which corresponding reference symbols indicate corresponding parts, and in which:
FIG. 3 depicts an embodiment of a passive force system of the positioning system of FIG. 2;
FIG. 9 schematically depicts a force characteristic of the passive force system of FIG. 8a, as a function of the relative position of the main stage and the substage in the moving direction.
FIGS. 10 to 13 depict further embodiments of force systems as can be applied in a positioning system according to the present invention.
FIG. 14 schematically depicts a force characteristic of the force system of FIG. 13, as a function of the relative position of the stage and the frame in the moving direction.
FIG. 15 depicts a further embodiment of a magnet assembly as can be applied in a positioning system according to the present invention.

DETAILED DESCRIPTION

Figure 1:
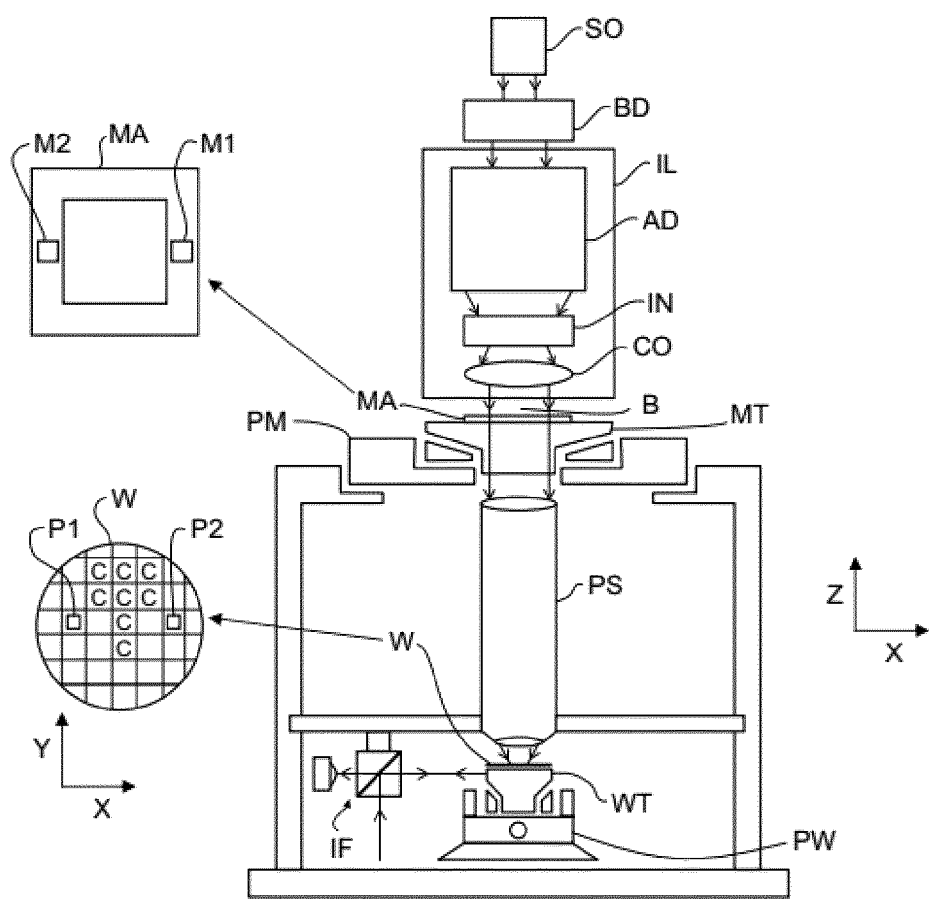
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation or any other suitable radiation), a patterning device support or mask support structure (e.g. a mask table) MT constructed to support a patterning device (e.g. a mask) MA and connected to a first positioning device PM configured to accurately position the patterning device in accordance with certain parameters. The apparatus also includes a substrate table (e.g. a wafer table) WT or "substrate support" constructed to hold a substrate (e.g. a resist-coated wafer) W and connected to a second positioning device PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, to direct, shape, or control radiation.

The patterning device support holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support may be a frame or a table, for example, which may be fixed or movable as required. The patterning device support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the patterning device (e.g. mask) and the projection system. Immersion techniques can be used to increase the numerical aperture of projection systems.

The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the patterning device support (e.g., mask table) MT, and is patterned by the patterning device. Having traversed the patterning device (e.g. mask) MA, the radiation beam B passes through the projection system PS, which focuses the beam onto a target portion C of the substrate W. With the aid of the second positioning device PW and position sensor IF (e.g. an interferometric device, linear encoder or capacitive sensor), the substrate table WT can be moved accurately, e.g. so as to position different target portions C in the path of the radiation beam B. Similarly, the first positioning device PM and another position sensor (which is not explicitly depicted in FIG. 1) can be used to accurately position the patterning device (e.g. mask) MA with respect to the path of the radiation beam B, e.g. after mechanical retrieval from a mask library, or during a scan.

Patterning device (e.g. mask) MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g. mask) MA, the patterning device alignment marks may be located between the dies.

The depicted apparatus could be used in at least one of the following modes:

1. In step mode, the patterning device support (e.g. mask table) MT or "mask support" and the substrate table WT or "substrate support" are kept essentially stationary, while an entire pattern imparted to the radiation beam is projected onto a target portion C at one time (i.e. a single static exposure). The substrate table WT or "substrate support" is then shifted in the X and/or Y direction so that a different target portion C can be exposed. In step mode, the maximum size of the exposure field limits the size of the target portion C imaged in a single static exposure.

2. In scan mode, the patterning device support (e.g. mask table) MT or "mask support" and the substrate table WT or "substrate support" are scanned synchronously while a pattern imparted to the radiation beam is projected onto a target portion C (i.e. a single dynamic exposure). The velocity and direction of the substrate table WT or "substrate support" relative to the patterning device support (e.g. mask table) MT or "mask support" may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the patterning device support (e.g. mask table) MT or "mask support" is kept essentially stationary holding a programmable patterning device, and the substrate table WT or "substrate support" is moved or scanned while a pattern imparted to the radiation beam is projected onto a target portion C. In this mode, generally a pulsed radiation source is employed and the programmable patterning device is updated as required after each movement of the substrate table WT or "substrate support" or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Embodiments of the first and/or second positioning devices PM, PW will now be described in more detail with reference to FIGS. 2-6. These embodiments are not limited to the first and second positioning devices PM, PW, but serve as an example that may be applied for other applications as well.

Figure 2:
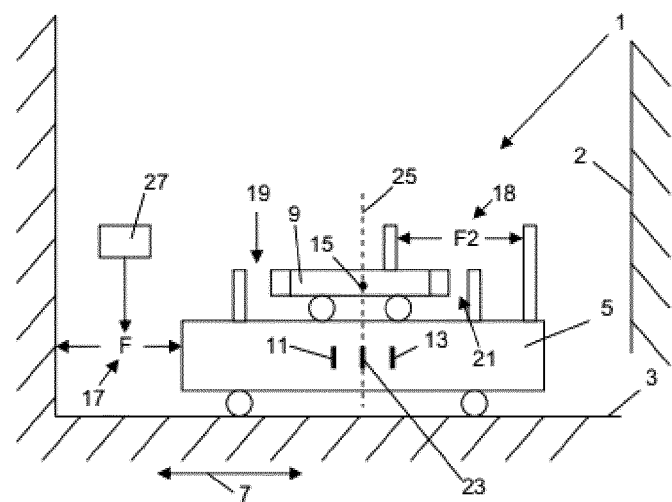
FIG. 2 depicts a positioning system according to another embodiment of the invention.

FIG. 2 shows a schematic representation of a positioning system 1 according to an embodiment of the invention. The positioning system 1 includes a frame 3, which can be a support frame or a base frame of the lithographic apparatus of FIG. 1.

The positioning system 1 further includes a main stage 5 which is moveable with respect to the frame 3 in a moving direction 7, and a substage 9 which is moveable in the moving direction 7 between a first position 11 and a second position 13 relative to the main stage 5. The position of the substage 9 with respect to the main stage 5 is indicated by the position of a centre of gravity 15 of the substage 9. The first and second position 11,13 are therefore indicated on the main stage 5 and define the stroke possible for the centre of gravity 15 of the substage 9. To make it easier to see the relative position of the centre of gravity 15 with respect to the main stage 5, a dashed line 25 is drawn through the centre of gravity 15.

The substage 9 may be a substrate or patterning device support and is in this embodiment supported by the main stage 5. However, an embodiment in which both the substage 9 and main stage 5 are supported by the frame 3 is also envisaged. The substage 9 and main stage 5 can be broadly termed a first and a second stage, respectively.

Between the main stage 5 and the frame 3, a main actuator 17 is provided to apply a force F to the main stage 5 with respect to the frame 3 in the moving direction 7. The main actuator 17 may be a moving magnet system with a coil system which cooperates with a permanent magnet system, wherein for instance the coil system is located on the frame 3 and the permanent magnet system is located on the main stage 5. The main actuator 17 may also be a moving coil system, in which the coil system is located on the main stage 5 and the permanent magnet system is located on the frame 3. In an embodiment, the main actuator 17 may also be a positioning system according to the second aspect of the invention, as will be discussed further on.

Between the main stage 5 and the substage 9, a passive force system is provided, including two magnet systems 19,21, wherein each magnet system 19,21 is configured to apply a force in the moving direction to the substage 9 in a non-contact manner. The forces of the magnet systems 19,21 result in a resultant force, i.e. a vector sum of the forces, applied to the substage 9 in the moving direction by the passive force system, wherein a magnitude and/or a direction of the resultant force depends on the position of the substage 9 relative to the main stage 5.

The substage 9 has a zero-force position 23 between the first and second position 11,13 in which the resultant force has a zero magnitude. The zero-force position 23 is also indicated on the main stage 5. In FIG. 2, the substage 9 is shown in the zero-force position 23.

In an embodiment of the present invention, the resultant force as generated between the first and the second position may have a comparatively large amplitude near the first position and near the second position and has a comparatively low amplitude across a sub-range that is a portion of a range between the first and second position. In an embodiment, the sub-range may e.g. be approx. 50% of the range between the first position and the second position. Typically, the sub-range where the resultant force is comparatively low, also referred to as the low force sub-range, will be substantially in the middle of the range between the first position and the second position.

The positioning system 1 also includes a controller or control system 27 which is configured to position the substage 9 with respect to a reference object 2 in or near a desired position with the passive force system by positioning the main stage 5 relative to the frame 3 with the main actuator 17. The desired position can be any position with respect to the reference object 2 and may also be defined as a desired trajectory or as a desired velocity, acceleration, jerk, etc. The reference object 2 may be connected to the frame 3 or may be a separate object, for instance, the frame 3 may be a base frame, and the reference object may be a metrology frame.

The control system 27 may include at least one sensor to measure a position quantity of the substage and/or the main stage, wherein the control system 27 is configured to provide a drive signal to the main actuator on the basis of a desired position quantity and an output of the at least one sensor. Preferably, the at least one sensor measure the position quantity of the substage and the main stage with respect to the reference object 2, as this also provides a measure for the position of the substage relative to the main stage. It is however also envisaged that the position quantity of the main stage is measured with respect to the substage. However, a combination is also possible.

In an embodiment, the magnet systems 19,21 include passive magnetic elements, such as permanent magnets and/or elements including magnetizable material. In such embodiment, the force system may thus be considered a passive force system. Note that alternative embodiments will be discussed below, whereby the magnet systems as applied may include electromagnets as well. In such embodiments, the passive force system will be referred to as a magnetic force system, whereby the magnetic force system comprises at least two magnet systems, and whereby the magnet systems may be passive magnet systems comprising permanent magnets, active magnet systems comprising electromagnets or a combination thereof.

In the embodiment as shown, the passive magnetic elements of the magnet systems 19, 21 enable to displace the substage 9. By moving the main stage 5 for instance to the right in FIG. 2 with the main actuator, the substage 9 will move towards the first position with respect to the main stage 5. This will generate a non-zero resultant force on the substage 9 which can be used to position the substage with respect to the reference object 2. As the magnitude and/or the direction of the resultant force can be adjusted by setting the appropriate relative position of the substage with respect to the main stage, full control of the position of the substage with respect to the reference object 2 can be established.

A benefit of positioning the substage in a passive manner is that less heat is generated in or near the substage for the generation of forces, so that deformation of the substage and components like substrates and patterning devices on top of the substage is decreased. As there is no or at least less heat generated on the substage, cooling devices such as hoses carrying cooling fluids may also be omitted or reduced, resulting in less force disturbances and thus an improved position accuracy.

Another benefit may be that the total mass of the main stage and/or substage is decreased with respect to the case that an active magnet-coil system is used. A lower mass results in a faster positioning system for the same energy input.

For accurate positioning, the positioning system 1 may include a second actuator 18 between the substage and the main stage to apply a force F2 to the substage 9 with respect to the main stage 5 in the moving direction. The benefit of the passive force system is that the second actuator 18 can be designed relatively small as it only has to apply forces F2 to fine position the substage and suppress disturbances, which forces are smaller than the forces for coarse positioning and are applied by the passive force system. It is noted here explicitly that the presence of a second actuator 18 is not essential for the invention.

A stiffness of the passive force system is the rate of change of the magnitude of the resultant force with respect to a change in position of the substage relative to the main stage, i.e. in the moving direction. In an embodiment, the magnet systems are designed such that a magnitude of the stiffness in the zero-force position is less than the magnitude of the stiffness near the first or second position, i.e. the magnitude of the stiffness is minimal in the zero-force position and increases towards the first and second position. This means that when a second actuator is used for fine positioning in the zero-force position, the interference between the second actuator and the passive force system is minimized in the zero-force position, while the larger stiffness near the first and second position can beneficially be used for coarse positioning. In an embodiment of the present invention, the resultant force as generated between the first and the second position may have a comparatively large amplitude near the first position and near the second position and has a comparatively low amplitude across a sub-range that is a portion of a range between the first and second position. In an embodiment, the sub-range may e.g. be approx. 50% of the range between the first position and the second position. Typically, the sub-range where the resultant force is comparatively low, also referred to as the low force sub-range, will be substantially in the middle of the range between the first position and the second position.

Figure 4:
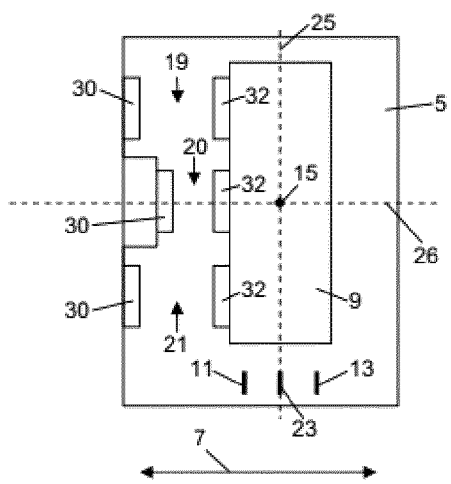
FIG. 4 depicts another embodiment of a passive force system of the positioning system of FIG. 2.
Figure 5:
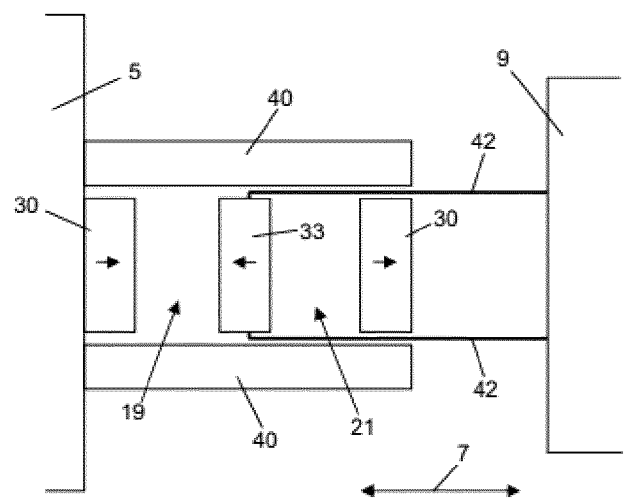
FIG. 5 depicts yet another embodiment of a passive force system of the positioning system of FIG. 2.

FIGS. 3-5 will now show in more detail alternative embodiments of the passive force system of the positioning system of FIG. 2.

FIG. 3 depicts a part of the positioning system 1 of FIG. 2, in particular the main stage 5 and the substage 9 from above in three situations A,B,C. The passive force system includes two magnet systems 19,21, wherein each of the magnet systems 19,21 includes a main stage magnet assembly 30 attached to the main stage 5, and a substage magnet assembly 32 attached to the substage 9.

Each main stage magnet assembly and substage magnet assembly includes a one-dimensional array of permanent magnets 30a-30d and 32a-32d respectively. A magnetic polarization of the permanent magnets is indicated by an arrow drawn inside each permanent magnet. Adjacent permanent magnets in the array have opposite magnetic polarizations, as have a permanent magnet of the main stage magnet assembly and an associated opposite permanent magnet of the substage magnet assembly, compare for example permanent magnet 30a and 32a. The main stage magnet assembly 30 and the substage magnet assembly 32 of each magnet system 19,21 are thus configured to repulse or repel each other. It can be noted that the application of two magnet systems, e.g. acting on opposite sides of a stage, which generate a repulsive or repelling force results in a stage equilibrium in the zero-force position. In an embodiment of the present invention, the magnet systems as applied in the passive force system, or the more general magnetic force system, are magnet systems that generate a repelling or repulsive force between the main stage and the substage or, as will be explained below, between a frame and a stage. In an embodiment of the present invention, the resultant force as generated between the first and the second position may have a comparatively large amplitude near the first position and near the second position and has a comparatively low amplitude across a sub-range that is a portion of a range between the first and second position. In an embodiment, the sub-range may e.g. be approx. 50% of the range between the first position and the second position. Typically, the sub-range where the resultant force is comparatively low, also referred to as the low force sub-range, will be substantially in the middle of the range between the first position and the second position.

It is noted here, that an embodiment with a two-dimensional array, in which adjacent permanent magnets have opposite magnetic polarization is also possible. For simplicity reasons, the linear array embodiment is described here as an example.

The main stage magnet assembly 30 and the substage magnet assembly 32 of each magnet system 19,21 are oriented opposite to each other in the moving direction 7. In particular, magnet systems 19 and 21 are symmetric about a line, in this case line 25 through the centre of gravity 15, of the substage when the substage is in the zero-force position 23. Magnet system 19 therefore applies a force to the substage in a positive direction of the moving direction 7, i.e. to the right in FIG. 3, which is opposite to a force applied to the substage by the magnet system 21. The magnitude of the forces depends on the relative position of the substage with respect to the main stage.

In situation A, the substage is in the zero-force position relative to the main stage, so that a gap 34 between the main stage magnet assembly 30 and the substage magnet assembly 32 of magnet system 19 is equal to a gap 36 between the main stage magnet assembly 30 and the substage magnet assembly 32 of magnet system 21, so that the forces applied to the substage by the magnet systems balance each other in the moving direction and a resultant force in the moving direction has a zero magnitude, i.e. is absent.

In situation B, the main stage 5 has been positioned by the control system such that the substage 9 is in a position between the first position 11 and the zero-force position 23 as indicated by line 25 through the centre of gravity 15 of the substage. As a result, the gap 34 is smaller than the gap 36, so that the repulsive force of magnet system 19 is larger than the repulsive force of magnet system 21. As a result, a resultant force Fr is applied to the substage in the moving direction towards the zero-force position. By positioning the substage in this position relative to the main stage, the substage can be accelerated to the right, i.e. the positive direction of the moving direction.

In situation C, the main stage 5 has been positioned by the control system such that the substage 9 is in a position between the zero-force position 23 and the second position 13 as indicated by line 25 through the centre of gravity 15 of the substage. As a result, the gap 36 is smaller than the gap 34, so that the repulsive force of magnet system 19 is smaller than the repulsive force of magnet system 21. As a result, a resultant force Fr is applied to the substage in the moving direction towards the zero-force position. By positioning the substage in this position relative to the main stage, the substage can be accelerated to the left, i.e. a negative direction of the moving direction.

The benefit of the embodiment according to FIG. 3 is that the gaps 34,36 can be relatively small while keeping the magnitude of the stiffness of the passive force system in the zero-force position minimal. This is caused by the opposite polarization of adjacent magnets in a magnet assembly. A small gap 34,36 is preferred as this requires less effort of the main actuator to position the main stage with respect to the frame such that a desired resultant force is applied to the substage. When a desired force is required, only a small relative movement is sufficient. A minimal stiffness in the zero-force position is beneficial for fine positioning the substage with respect to the frame as there is less interference between the passive force system and a possible second actuator intended for fine positioning of the substage. It also allows less accurate positioning of the main stage relative to the substage as a small position error will not result in a large force error applied to the substage.

By providing magnet assemblies 30,32 in which adjacent magnets have opposite polarizations, the magnetic field strength at a distance of the magnet assemblies is decreased with respect to for instance the situation in which the polarizations are parallel, so that the gap 34,36 can be made smaller for the same magnitude of stiffness in the zero-force position.

The magnitude of the stiffness can also be influenced by the size of the magnets, in particular the magnet pole pitch. The sensitivity to demagnetization and force magnitude can be adjusted by setting a thickness of the magnets. A person skilled in the art can thus design a magnet configuration such that the sensitivity to demagnetization is low and set the magnitude of the stiffness as low as possible as is required for the system.

As a possible embodiment of the invention the configuration of the magnet system 19 and 21 as shown in FIG. 3 indicates two time four magnets, but the number of magnets per magnet stack and the stator pole distance as indicated by references 34, 36 may be varied while optimizing different design parameters as described above. Finite element simulations indicate for example other advantageous configurations depending on such specific requirements while varying the number of magnets per magnet stacks and the stator pole distance. The requirements for a specific configuration may depend on the required maximum resultant force (Fr), the stator pole distance relating the relative movement between the substage 9 and the main stage 5, the desired stiffness of the magnetic system at maximum force distance (referring to FIG. 3B and FIG. 3C) and the desired stiffness of the magnetic system at zero force distance (referring to FIG. 3A). Some examples of possible configurations and the resulting design parameters based on finite element simulations are shown in the following table, but other magnet stack configurations may also be possible:

| 4 magnets per stack (maximum force 680 [N]) | | | | |
|---|---|---|---|---|
| Stator pole distance [mm] | 22 | 32 | 42 | 62 |
| Stiffness at maximum force distance [N/m] | 2.3E5 | 2.3E5 | 2.3E5 | 2.3E5 |
| Stiffness at zero force distance [N/m] | 13000 | 2700 | 770 | 150 |
| 10 magnets per stack (maximum force 520 [N]) | | | | |
| Stator pole distance [mm] | 12 | 22 | 32 | 42 |
| Stiffness at maximum force distance [N/m] | 3.2E5 | 3.2E5 | 3.2E5 | 3.2E5 |
| Stiffness at zero force distance [N/m] | 11150 | 650 | 180 | 80 |
| 12 magnets per stack (maximum force 430 [N]) | | | | |
| Stator pole distance [mm] | 12 | 22 | 32 | 42 |
| Stiffness at maximum force distance [N/m] | 3.2E5 | 3.2E5 | 3.2E5 | 3.2E5 |
| Stiffness at zero force distance [N/m] | 5500 | 400 | 125 | 51 |

The configuration of FIG. 3 of the magnet systems could also be adapted so that the main stage magnet assembly 30 and the substage magnet assembly 32 attract each other. The consequence is that the resultant forces in situations B and C are opposite to the shown resultant forces and thus the direction of the resultant force Fr is towards the first position and second position respectively for situation B and C. As this system is inherently unstable, this requires a control scheme configured for an unstable system as is known to a person skilled in the art of control to make the total system stable.

FIG. 4 shows an another alternative embodiment for the passive force system. The substage is only shown in the zero-force position as the general working principle is similar to the embodiment of FIG. 3. The passive force system of this embodiment includes three magnet systems 19-21, each magnet system including a substage magnet assembly 32 attached to the substage 9, and a main stage magnet assembly 30 attached to the main stage 5. The main stage magnet assembly 30 and the substage magnet assembly 32 of the magnet system 20 are configured to repulse each other. The main stage magnet assembly 30 and the substage magnet assembly 32 of the magnet systems 19,21 are configured to attract each other.

The magnet systems 19-21 are positioned symmetric about a line 26 through the centre of gravity 15, so that the forces applied to the substage by the magnet systems will not result in a rotation of the substage about an axis perpendicular to the drawing plane. The above described symmetry is not mandatory, especially not if rotation is desired or is no issue, for instance due to the presence of a guide system.

Due to the difference in gap between the magnet systems 19, 21 and the magnet system 20, the repulsive force of magnet system 20 will increase more then the attractive forces of magnet systems 19,21 when the substage moves relatively towards the first position 11, so that a resultant force is then applied to the substage which is directed to the zero-force position. When the substage is moved relatively towards the second position, the repulsive force of magnet system 20 will decrease more than the attractive forces of magnet systems 19,21, so that a resultant force is applied to the substage, which is directed to the zero-force position.

Also for this configuration, the magnet systems can be adapted so that for instance the magnet systems 19, 21 apply a repulsive force, and magnet system 20 applies an attractive force. It is also possible to change the gaps between the main stage magnet assemblies 30 and the substage magnet assemblies 32, so that the gap of magnet system 20 is larger than the gap of magnet systems 19,21. Such adaptations may also require a change in strength of the permanent magnets of the magnet systems and/or another control scheme of the control system when for instance the system becomes unstable.

FIG. 5 depicts an alternative embodiment of a passive force system according to the invention. The passive force system includes two magnet systems 19,21, each magnet system configured to apply a force in the moving direction to a substage 9 with respect to a main stage 5 in a non-contact manner. Each magnet system 19,21 includes a main stage magnet assembly 30 attached to the main stage 5 and a substage magnet assembly 33 attached to the substage 9. In this embodiment, the substage magnet assemblies of the magnet systems 19,21 are integrated, i.e. combined, into one single substage magnet assembly 33. In this example, a magnet assembly 30,33 includes one permanent magnet, wherein the magnetic polarization of the magnet is indicated by an arrow drawn inside the permanent magnets. The magnet assemblies are thus configured to repulse each other. The magnet assemblies however, may also be configured similar to the magnet assemblies of FIG. 3 and include multiple magnets in which adjacent magnets have opposite polarizations.

Substage magnet assembly 33 is attached to the substage 9 via links 42. A similar passive force system as shown in FIG. 5 may also be provided on the opposite side of the substage 9 seen in the moving direction 7.

Guides 40 are provided to guide movement of the substage magnet assembly 33 and thus of the substage 9. Between the guides 40 and the substage magnet assembly 33 or the links 42 a bearing, such as an air bearing may be provided. This may also be beneficial to suppress a stiffness of the magnet systems in directions perpendicular to the moving direction.

Figure 6:
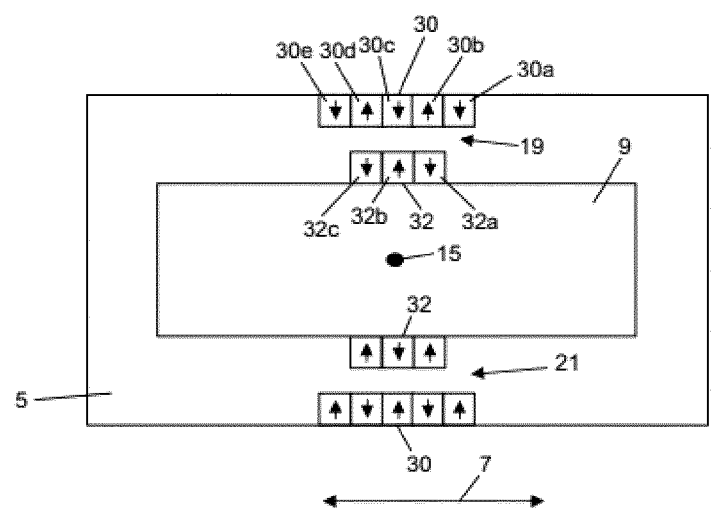
FIG. 6 depicts a further embodiment of a passive force system of the positioning system of FIG. 2.

FIG. 6 depicts another alternative embodiment of a passive force system according to the invention. Shown is a main stage 5 and a substage 9 which is moveable with respect to the main stage 5. The passive force system includes two magnet systems 19, 21, each being positioned on opposite sides of the substage 9 seen in a direction perpendicular to a moving direction 7. Each magnet system includes a main stage magnet assembly 30 attached to the main stage 5 with, for example, five permanent magnets 30a-30e of which a magnetic polarization is indicated by arrows in the magnets. Each magnet system also includes a substage magnet assembly 32 attached to the substage 9 with, for example, three permanent magnets 32a-32c of which the magnetic polarization is indicated by arrows in the magnets.

The substage 9 is shown in a zero-force position with respect to the main stage 5. The magnet assemblies are configured to repulse each other in this position. It is noted here that the magnet configuration results in an unstable zero-force position, so that when the substage is slightly moved to the left or right, the magnet assemblies will align themselves into a position that they attract each other. The force in the moving direction that tends to align the magnet assemblies can be used to position the substage 9 relative to a frame 3. In fact, each system shown in FIGS. 3-5 may also have a similar behavior in a direction substantially perpendicular to the moving direction, so that the passive force system can also be used to position the substage 9 in another direction. So two-dimensional positioning is also possible without altering the structural features of the passive force system. The configuration of the control system may have to be adapted for the two-dimensional case, as in that case the main actuator may have to position the main stage in two directions as well. For this embodiment, it is desirable that the moving range of the substage be limited to the magnetic pole pitch in order to keep control of the position relatively simple.

Figure 7:
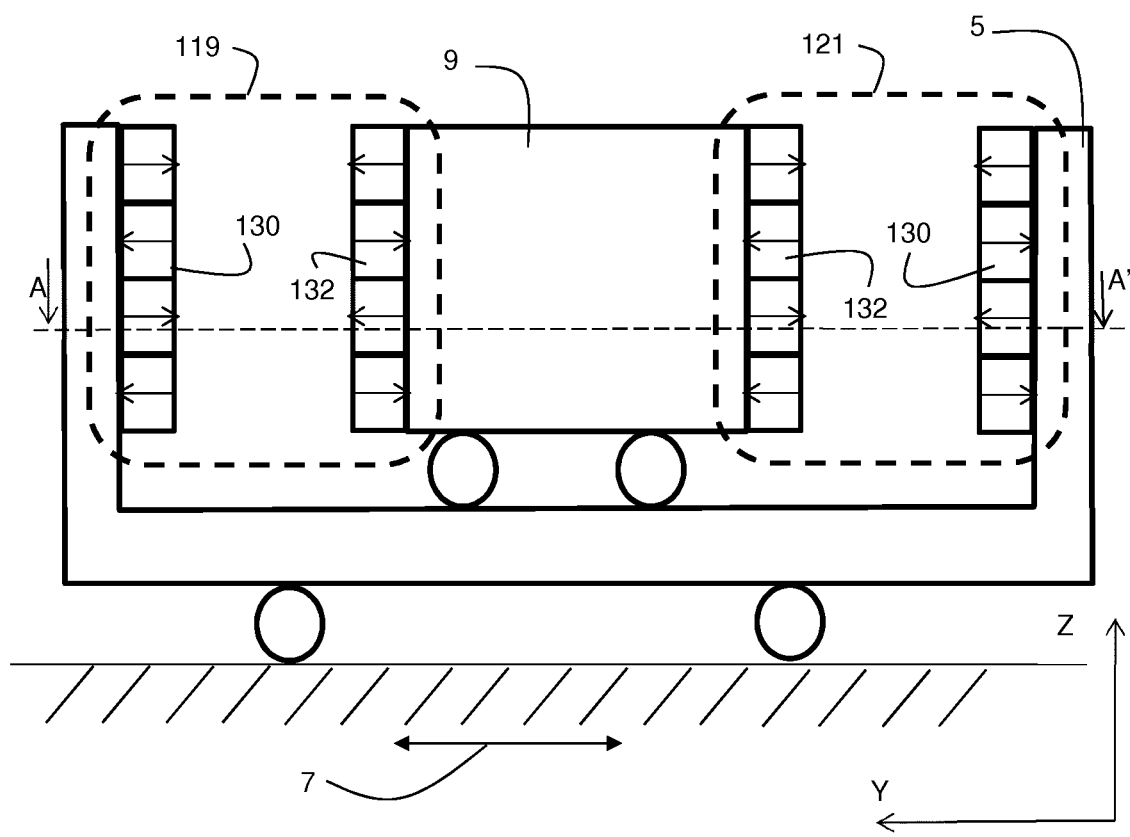
FIGS. 7(a) and (b) depict a further embodiment of a passive force system as can be applied in a positioning system according to the present invention.
Figure 7:
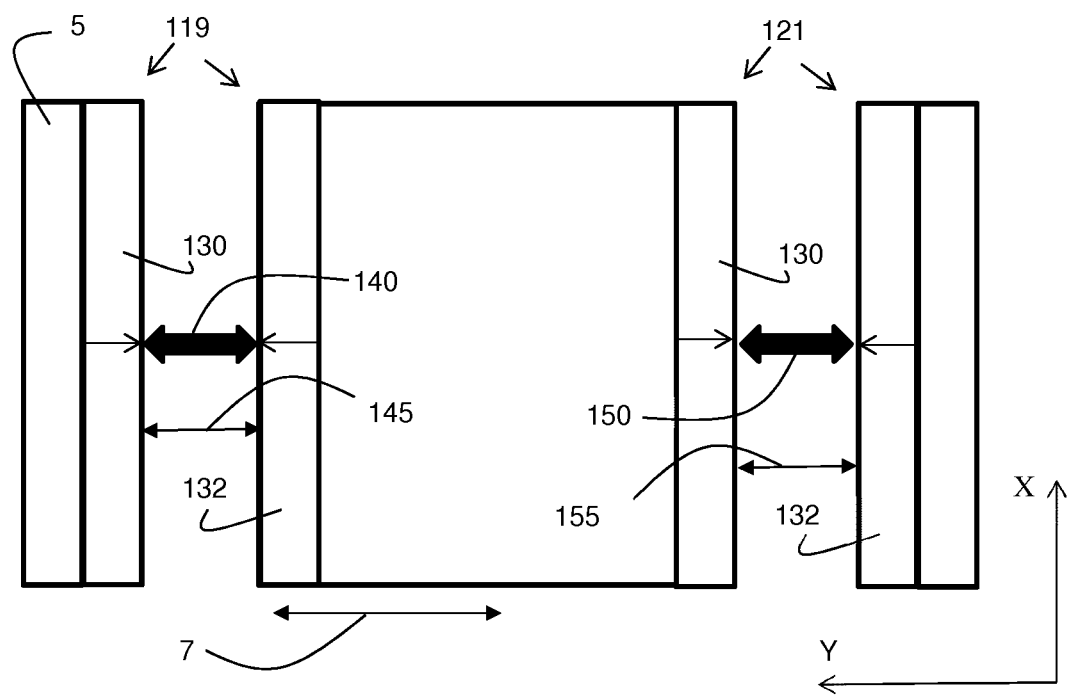

FIG. 7 schematically shows yet another embodiment of a passive force system as can be applied in a positioning system according to the present invention. FIG. 7(a) schematically shows a cross-section view of the passive force system in a vertical plane, whereas FIG. 7(b) schematically shows a cross-section view of the passive force system in a horizontal plane, in particular a cross-section along the plane A-A' as indicated in FIG. 7(a).

FIG. 7(a) schematically shows a main stage 5 and a substage 9 which is moveable with respect to the main stage 5. The passive force system includes two magnet systems 119, 121, each being positioned on opposite sides of the substage 9. Each magnet system includes a main stage magnet assembly 130 attached to the main stage 5, and a substage magnet assembly 132 attached to the substage 9. In the embodiment as shown, each of the main stage magnet assemblies 130 and substage magnet assemblies 132 comprises an array of four permanent magnets that are alternatingly polarized, indicated by the arrows in the magnets, whereby the magnet arrays 130 and 132 that form a magnet system are configured in such manner as to generate a repelling force in the moving direction or direction of movement 7.

FIG. 7(b) schematically shows a cross-sectional view of the main stage 5, the substage 9 and the magnet systems 119, 121. As can be seen, the magnets as applied in the magnet systems 119 and 121 are elongated in the X-direction.

The passive force system, comprising magnet systems 119, 121 as shown in FIGS. 7(a) and (b) essentially operates in the same manner as the passive force system of FIG. 3. Comparing the magnet systems 19, 21 with the magnet systems 119, 121, the skilled person can easily assess that the magnet systems 19, 21 merely have a different orientation compared to the magnet systems 119, 121. In both cases, each of the magnet systems generated a repelling force, indicated by the arrows 140, 150 between the main stage 5 and the substage 9 in the moving direction 7. In a similar manner as discussed above, the amplitude of the repelling or repulsive forces 140, 150 generated by the magnet systems 119, 121 depends on the distance or gap between the main stage magnet assembly 130 and the substage magnet assembly 132 that form the magnet system. In particular, the repelling force as generated by any of the magnet systems 119, 121 is inversely proportional with the distance or gap 145, 155 between the cooperating magnet assemblies 130, 132. As a consequence, in case the gap 145 is smaller than the gap 155, the repelling force 140 will be larger than the repelling force 150. As a result, a resulting force will be generated that is directed in the negative Y-direction. In case the gap 145 is larger than the gap 155, the repelling force 140 will be smaller than the repelling force 150. As a result, a resulting force will be generated that is directed in the positive Y-direction.

Figure 8A:
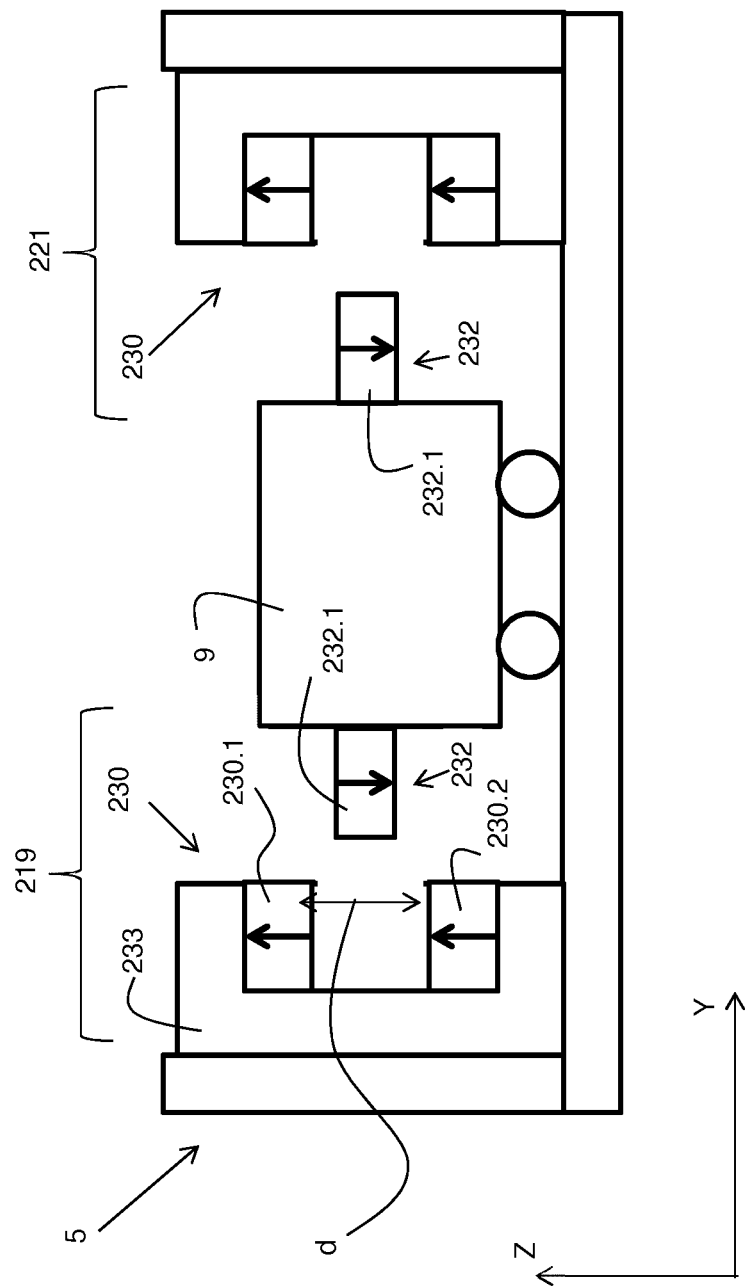
FIGS. 8a and 8b depict further embodiments of a passive force system as can be applied in a positioning system according to the present invention.

FIG. 8a schematically shows yet another passive force system that can be applied in a positioning system according to the present invention. FIG. 8a schematically shows a cross-sectional view of a main stage 5 and a substage 9 which is moveable with respect to the main stage 5. The passive force system includes two magnet systems 219, 221, each being positioned on opposite sides of the substage 9. Each magnet system includes a main stage magnet assembly 230 attached to the main stage 5, and a substage magnet assembly 232 attached to the substage 9. In the embodiment as shown, the main stage magnet assembly comprises a pair of magnets 230.1, 230.2 having the same magnetic polarization in a direction perpendicular to the moving direction or direction of movement 7. The magnets 230.1, 230.2 are spaced apart from each other by a distance d, taken along the polarization direction as indicated by the arrows in the magnets 230.1, 230.2 In the embodiment as shown, the magnets 230.1, 230.2 are mounted to a magnetic yoke 233, the magnetic yoke being configured to form a magnetic circuit connecting the magnets 230.1, 230.2. The magnetic yoke as shown provides in a path having a low magnetic resistance connecting the magnets 230.1, 230.2. As a result, a comparatively high magnetic field can be generated in the gap with a length d between the magnets 230.1, 230.2. The magnetic yoke as schematically shown in FIG. 8a has a C-shaped cross-section and may thus be referred to as a C-shaped core.

In the embodiment as shown, the substage magnet assembly 232 comprises a magnet 232.1 having a magnetic polarization that is opposite to the magnetic polarization of the magnets 230.1, 230.2.

In an embodiment, the substage magnet assemblies of the magnet assemblies 219,212 can be combined into one substage magnet assembly that is shared by both magnet assemblies 219, 212. The same holds for the magnet assemblies that are described below.

Figure 8B:
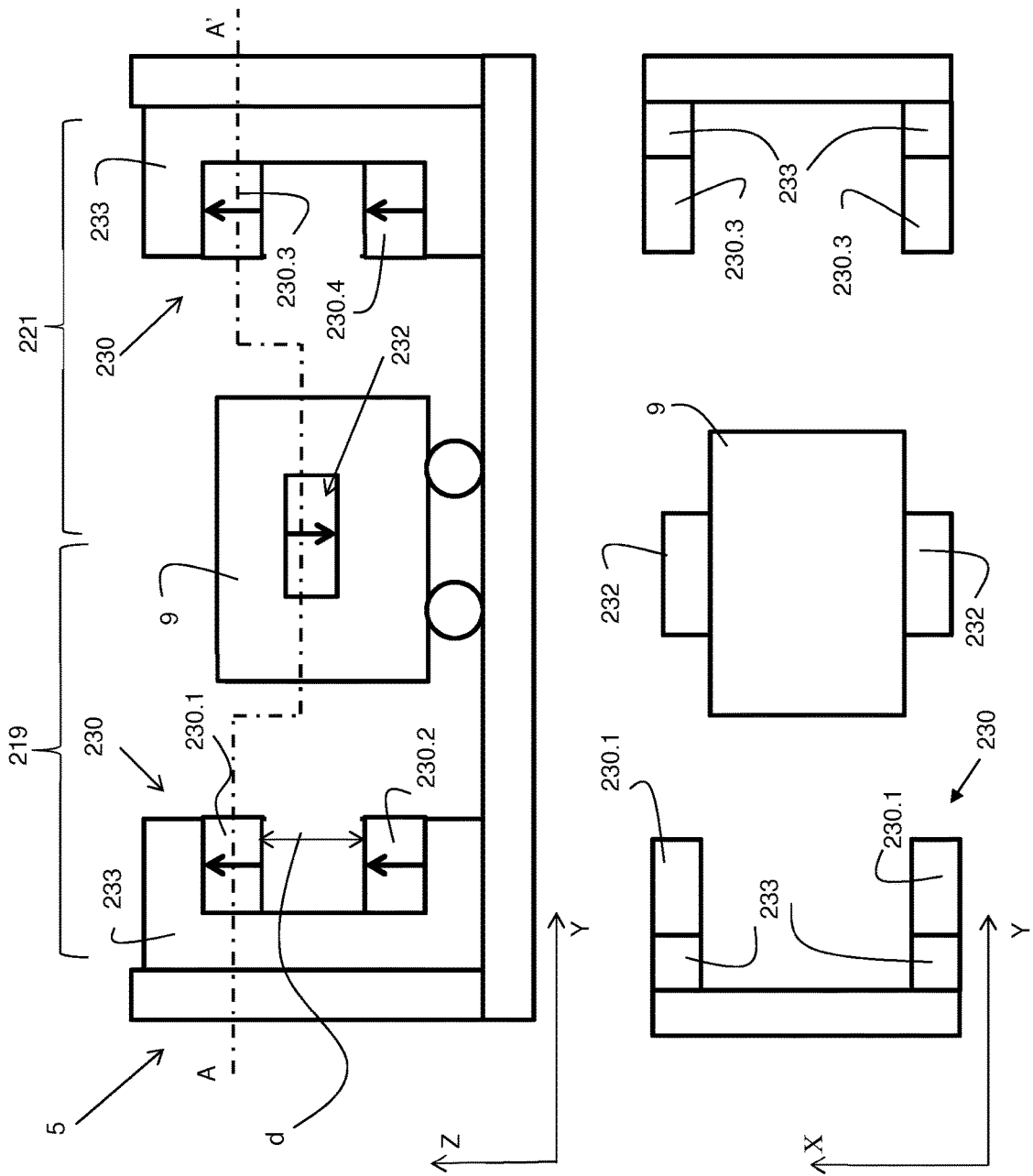

Such an embodiment is schematically shown in FIG. 8b, whereby the same reference numbers are used as in FIG. 8a. The top portion of FIG. 8b schematically shows a side view of a passive force system that can be applied in a positioning system according to the present invention (YZ-view), whereas the bottom portion schematically shows a cross-sectional view of the passive force system through the plane indicated by line A-A'. FIG. 8b schematically shows a main stage 5 and a substage 9 which is moveable with respect to the main stage 5. The passive force system includes two magnet systems 219, 221, each being positioned on opposite sides of the substage 9. Each magnet system includes a main stage magnet assembly 230 attached to the main stage 5. Further, the magnet systems 219 and 221 share a substage magnet assembly 232 attached to the substage 9. In the embodiment as shown, the substage magnet assembly 232 comprises, as can be seen in the cross-sectional XY view, two magnets 232 arranged on both sides of the main stage 5 that are parallel to the ZY-plane. When the main stage 5 is moved towards the left, the magnets 232 will interact with the magnets 230.1 and 230.2 of the main stage magnet assembly, whereas, when the main stage 5 is moved towards the right, the magnets 232 will interact with the magnets 230.3 and 230.4 of the main stage magnet assembly. In the embodiment as shown, the main stage magnet assembly comprises a pair of magnets 230.1, 230.2 having the same magnetic polarization in a direction perpendicular to the moving direction or direction of movement 7. The magnets 230.1, 230.2 are spaced apart from each other by a distance d, taken along the polarization direction as indicated by the arrows in the magnets 230.1, 230.2 In the embodiment as shown, the magnets 230.1, 230.2 are mounted to a magnetic yoke 233, the magnetic yoke being configured to form a magnetic circuit connecting the magnets 230.1, 230.2. In a similar manner, the magnets 230.3, 230.4 are spaced apart from each other by a distance d, taken along the polarization direction as indicated by the arrows in the magnets 230.3, 230.4 In the embodiment as shown, the magnets 230.3, 230.4 are mounted to a magnetic yoke 233, the magnetic yoke being configured to form a magnetic circuit connecting the magnets 230.3, 230.4. The magnetic yoke as shown provides in a path having a low magnetic resistance connecting the magnets 230.3, 230.4. As a result, a comparatively high magnetic field can be generated in the gap with a length d between the magnets 230.3, 230.4. The magnetic yokes 233 as schematically shown in FIG. 8b has a C-shaped cross-section and may thus be referred to as a C-shaped core. In the embodiment as shown, as can be seen from the cross-section view at the bottom portion of FIG. 8b, each of the magnet systems 219, 221 comprises two C-shaped cores, spaced apart in the X direction such that the stage 5 can be arranged between them, when the magnets 232 interact with the magnets of the main stage magnet assembly.

It has been devised by the inventors that such magnet system configuration enables to generate a much higher repelling force, for a given available volume. In particular, when the magnet 232.2 is partially inserted in the gap between the magnets 230.1 and 230.2 of the main stage magnet assembly 230, a high repelling force, acting in the moving direction 7, can be generated.

FIG. 9 schematically shows a graph Fr indicative of the generated combined repelling force of two magnet systems such as magnet system 219 or 221, when they are e.g. arranged on opposite sides of a stage, as e.g. shown in FIG. 8a. FIG. 9 schematically depicts the generated force F in the Y-direction acting on the substage 9 when the substage 9 is displaced along the Y-direction (as indicated in FIG. 8a), whereby a position y=0 corresponds to a position whereby magnet 232.1 of the substage magnet assembly 232 of the magnet system 219 is inserted in the gap of the main stage magnet assembly 230 of the magnet system 219 and whereby a position y=T corresponds to a position whereby magnet 232.1 of the substage magnet assembly 232 of the magnet system 221 is inserted in the gap of the main stage magnet assembly 230 of the magnet system 221. As can be seen from the graph Fr, a comparatively large positive force Fr is generated when the magnet 232.1 of the substage magnet assembly 232 of the magnet system 219 is partially inserted in the gap of the main stage magnet assembly 230 of the magnet system 219 and a comparatively large negative force Fr is generated when the magnet 232.1 of the substage magnet assembly 232 of the magnet system 221 is partially inserted in the gap of the main stage magnet assembly 230 of the magnet system 221.

The generation of the repelling force by the magnet systems 219 and 221 can be attributed to the following features:

The magnet systems 219 and 221 each have a first magnet assembly, e.g. referred to above as the main stage magnet assembly, that forms a magnetic circuit having a gap, whereby the first magnet assembly is configured to generate a magnetic flux in the gap, and a second magnet assembly, e.g. referred to as the substage magnet assembly, comprising at least one magnet, whereby the first and second magnet assemblies are configured to cooperate to generate a repelling force and whereby the first and second magnet assemblies are configured such that the at least one magnet of the second magnet assembly can at least partly be inserted in the gap. Referring to FIGS. 7 and 8, it can be pointed out that the first magnet assembly may be mounted to the substage instead of being mounted to the main stage and the second magnet assembly may be mounted to the main stage instead of being mounted to the substage.

In order to generate a repelling force between a first and second magnet assembly, other embodiments as the ones shown in FIGS. 3 to 8 can be considered as well. Further embodiments of magnet systems as can be applied in a positioning system according to the present invention are explained in more detail below.

In particular, FIG. 10 schematically shows an embodiment of a passive force system 319, 321 with modified main stage magnet assemblies 330, compared to the main stage magnet assembly 230 as shown in FIG. 8a or 8b. In the embodiment as shown, the substage magnet assemblies 232 of the passive force systems 319 and 321 are the same as in FIG. 8a. In the embodiment as shown, main stage magnet assemblies 330 form a magnetic circuit with a gap, each of the magnet assemblies 330 comprising a permanent magnet 330.1 and a magnetic yoke 330.2 for guiding the magnetic flux, so as to generate a magnetic flux 335 in the gap 340 of the magnetic circuit.

As will be appreciated by the skilled person, various other arrangements of a magnetic yoke and one or more permanent magnets may be considered as well, in order to generate a magnetic flux that crosses a gap of a magnetic circuit.

The embodiments of the passive force system as applied in a positioning system according to the present invention as discussed so far can be considered passive systems because of the use of permanent magnets to generated the repelling or repulsive force.

Figure 11:
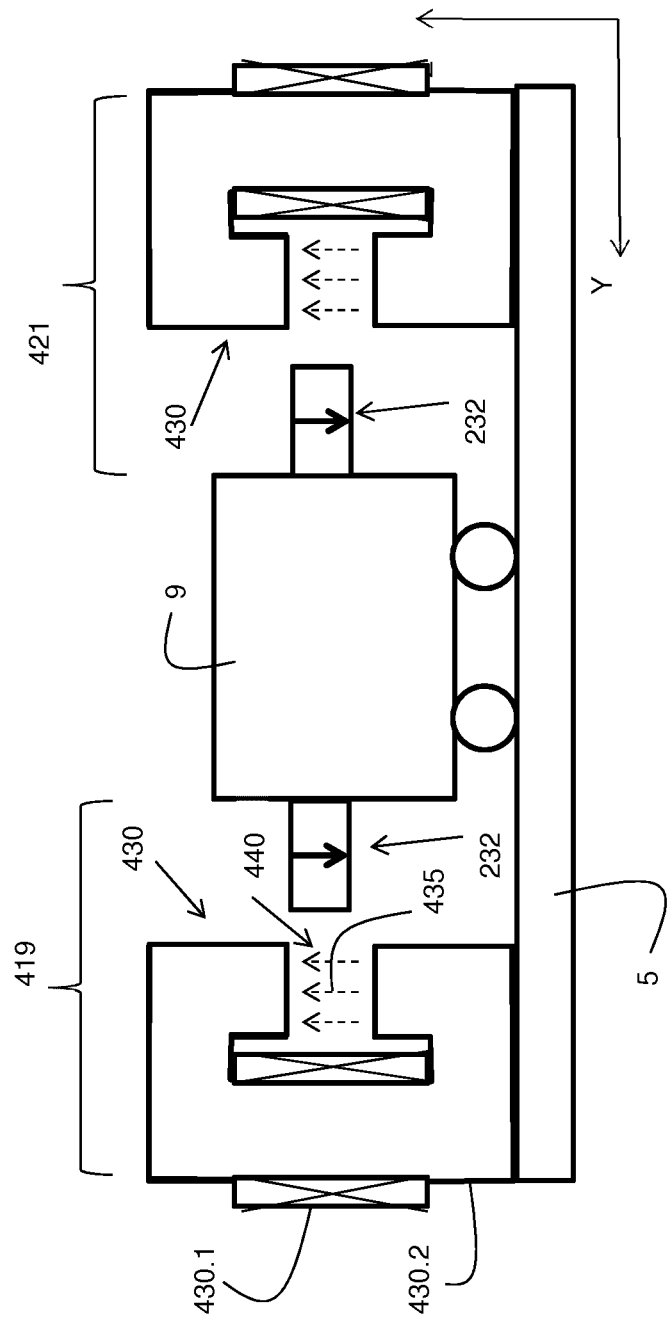
Figure 12:
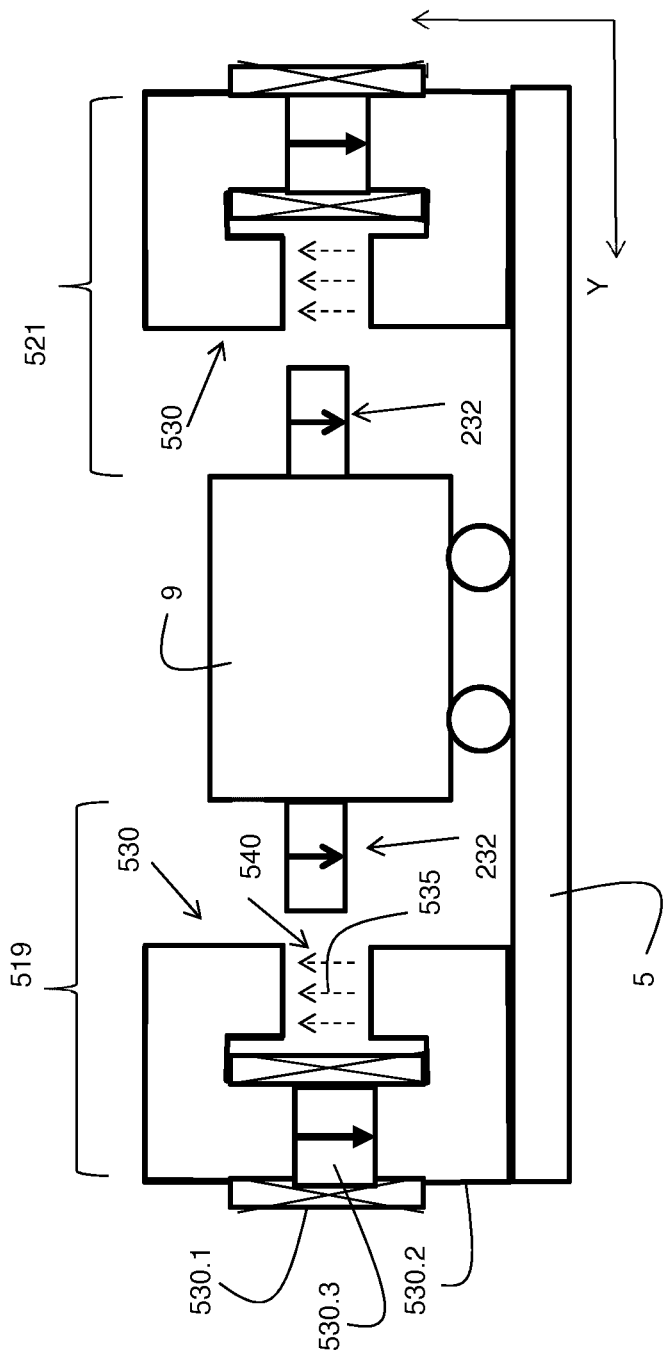

FIGS. 11 and 12 schematically show embodiments of force systems, referred to as magnetic force systems which comprise magnet assemblies that comprise active components such as electromagnets.

FIG. 11 schematically shows an embodiment of a magnetic force system comprising magnet assemblies 419, 421 arranged to exert a force between a substage 9 and a main stage 5, with modified main stage magnet assemblies 430, compared to the main stage magnet assembly 330 as shown in FIG. 10. In the embodiment as shown, the substage magnet assemblies 232 of the magnetic force systems 419 and 421 are the same as in FIG. 8a. In the embodiment as shown, main stage magnet assemblies 430 form a magnetic circuit with a gap 440, each of the magnet assemblies 430 comprising a coil 330.1 wound about a magnetic yoke 330.2 for guiding the magnetic flux, so as to generate a magnetic flux 435 in the gap 440 of the magnetic circuit. Using such a magnetic force system, the amplitude of the generated repelling or repulsive forces as generated between the main stage magnet assemblies 430 and the substage magnet assemblies 232 can be controlled.

FIG. 12 schematically shows an embodiment of a magnetic force system comprising magnet assemblies 519, 521, whereby the main stage magnet assemblies 530 can be considered a combination of the main stage magnet assemblies 330 and 430. In particular, in the embodiment as shown, main stage magnet assemblies 530 form a magnetic circuit with a gap 540, each of the magnet assemblies 530 comprising a coil 530.1 wound about a magnetic yoke 530.2 for guiding the magnetic flux. The magnetic circuit further comprises a permanent magnet 530.3 arranged to generate a magnetic flux in the magnetic yoke 530.2. In the embodiment as shown, both the coil 530.1 and the permanent magnet 530.3 may thus contribute to the generation of the magnetic flux 535 in the gap 540 of the magnetic circuit.

The passive force systems and the magnetic force systems as described above may e.g. be applied, according to an aspect of the invention, to drive a substage, the substage e.g. configured to hold an object such as a patterning device or a substrate.

In order to generate the required magnetic flux, the magnet systems as applied in either the passive force systems of the magnetic force systems may e.g. comprises permanent magnets and/or electromagnets. The use of super-conductive coils to generate the magnetic flux of either the main stage magnet assembly or the substage magnet assembly can be considered as well.

According to a second aspect of the present invention, the passive force systems or magnetic force systems as discussed above may also be applied in a positioning device such as positioning devices PW and PM and discussed above, e.g. to drive a patterning device support or a substrate support. In such arrangement, the passive force systems or magnetic force systems may replace or complement the operation of a long stroke actuator or motor that is typically applied to drive such supports. As already indicated above, in order to drive a main stage in a lithographic apparatus, one or more long stroke actuators or motors are typically provided between a frame, e.g. a base frame, and the main stage, in order to drive the main stage over comparatively large distances.

As an example, in case of a patterning device support PM as discussed above, one or more linear motors may be applied as long stroke actuators in order to move the patterning device support PM, e.g. over a range of 150 mm or more. However, the required power to drive such a stage may be substantial, thus also resulting in a substantial dissipation, which needs to be removed by means of cooling.

In an embodiment of the present invention, a positioning system is thus provided which comprises a passive force system or a magnetic force system and which may be applied to drive or facilitate the driving of a stage, e.g. a support in a lithographic apparatus, e.g. a patterning device support PM or a substrate support PW.

Figure 13:
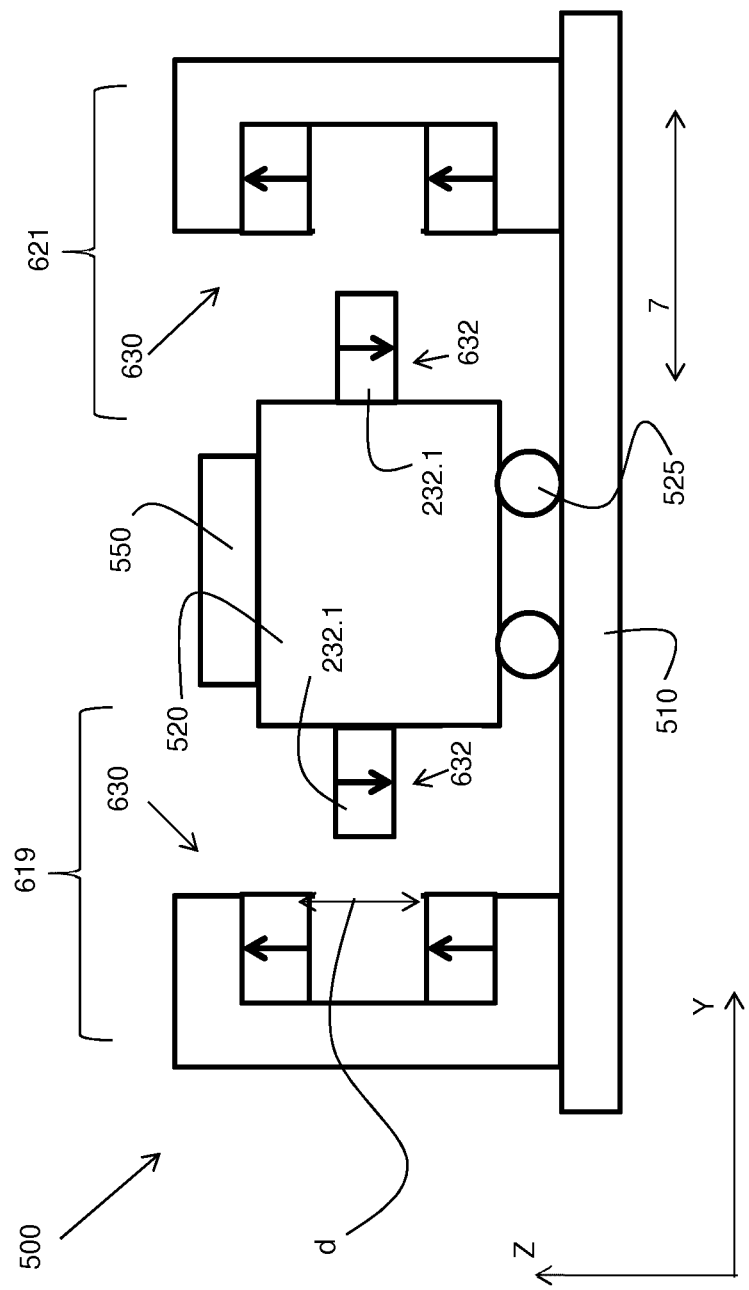

FIG. 13 schematically shows an embodiment of such a positioning system. The positioning system 500 comprises a frame 510 and a stage 520. In the embodiment as shown, a bearing 525 is provided to enable a substantially frictionless displacement of the stage 520 relative to the frame 510, at least in a moving direction 7, i.e. parallel to the Y-direction. The positioning system 500 further comprises a magnetic force system comprising a pair of magnet systems 619, 621. Each of the magnet systems of the pair of magnet system comprises a first magnet assembly 630 and a second magnet assembly 632. In the embodiment as shown, the first and second magnet assemblies 630 and 632 have similar constructions as the main stage magnet assemblies and substage magnet assemblies 230 and 232 shown in FIG. 8a. As will be understood, magnet assemblies as applied in FIGS. 10-12 could be applied as well. Note however that, compared to the arrangements shown in FIGS. 8, 10-12, the magnetic force system is arranged between a frame 510 and a stage 520, and the magnetic force system is configured to facilitate the displacement of the stage over comparatively large distances, e.g. 150 mm or more. As also mentioned above, in an embodiment, the substage magnet assemblies of the magnet assemblies 619,612 can be combined into one substage magnet assembly that is shared by both magnet assemblies 619, 612. In such embodiment, there may thus be one substage magnet assembly having one or more magnets that can be arranged at least partly in the gap of the main stage magnet assembly 630 of the magnet assembly 619 when the stage 520 is in the leftmost position and that can be arranged at least partly in the gap of the main stage magnet assembly 630 of the magnet assembly 621 when the stage 520 is in the rightmost position.

In an embodiment, the magnetic force system is configured to displace the stage over a distance or range (e.g. between a first and a second position) of approx. 300 mm, whereby, during a part or sub-range of said range, the amplitude of the generated resultant repelling force is comparatively low. Note that the required displacements of the main stage 5 relative to the substage 9 as described in FIGS. 2 to 12 would typically be much smaller, e.g. less than 10 mm.

It can further be noted that, compared to the embodiments of the positioning system according to the present invention whereby the magnetic force system or the passive force system is applied in between a main stage and a substage, the frame 510 as applied in the positioning system 500 is not driven by a longstroke actuator or motor. Rather, the frame 510 may e.g. be a base frame of the apparatus comprising the positioning system or may be mounted to such a base frame. In the latter case, the frame 510 may e.g. be mounted to such a base frame (not shown) via a bearing such as an airbearing or magnetic bearing, in order for the frame 510 to serve as a balance mass when the stage 520 is translated in the moving direction 7. As such, compared to the positioning system as shown in FIG. 2, the frame 510 of the positioning system 500 would typically not be driven by a longstroke actuator. As such, in order to displace the stage 520 relative to the frame 510 in the moving direction 7, an actuator or motor is required. The positioning system 500 according to the second aspect of the present invention thus comprises a motor or actuator 550, e.g. an electromagnetic linear motor, to drive the stage 520 relative to the frame 510 in the moving direction 7. Such a motor or actuator may e.g. be a linear motor that is configured to drive the stage 520 relative to the frame 510 over at least part of the operating range of the stage 520. In an embodiment, the electromagnetic motor may comprise a first member mounted to the stage 520 and a second member mounted to the frame 510; the first and second member being configured to cooperate to generate a driving force for driving the stage in the moving direction. In an embodiment, the first member may e.g. comprise a magnet array, while the second member comprises a coil or coil array.

Referring to FIG. 13, an operating range of the stage, relative to the frame 510 may be considered as the distance between a first position, whereby magnet assembly 532 of the magnetic force system 619 is inserted in the gap with distance d of the magnet assembly 530 of the magnetic force assembly 619, and a second position, whereby magnet assembly 532 of the magnetic force system 621 is inserted in the gap with distanced of the magnet assembly 530 of the magnetic force assembly 621.

The positioning system 500 may be operated in the following manner. Starting from the neutral or zero-force position as schematically shown in FIG. 13, whereby a resulting force of the magnet systems 619 and 621 on the stage 520 is substantially zero, a force can be exerted on the stage 520 by the motor 550, e.g. in the positive Y-direction. This will result in the stage 520 being displaced in the positive Y-direction. As a result of this displacement, the resulting force of the magnet systems 619 and 621 on the stage 520 will no longer be zero, but rather, a resulting force in the negative Y-direction will be generated, slowing down the stage 520. Once the stage 520 reverses direction, i.e. starts moving in the negative Y-direction, the motor force can be reversed, i.e. the motor force now acting in the negative Y-direction as well. The stage will then move, due to the motor force and the resulting force in the negative Y-direction, in the negative Y-direction beyond the neutral position, toward the magnet assembly 630 of the magnetic force system 619. At some point beyond the neutral position, the stage 520 will again reverses direction, i.e. will start moving in the positive Y-direction. Once the stage 520 reverses direction, i.e. starts moving in the positive Y-direction again, the motor force can be reversed, i.e. the motor force now acting again in the positive Y-direction as well. By repeating this process, the stage 520 will gradually start moving back and forth (along the positive Y-direction and the negative Y-direction) at an increasing speed. During each move, the exerted motor force, exerted by the motor 550 will increase the speed of the stage 520, as long as the exerted motor force exceed the frictional force that is exerted on the stage 520. As such, with a comparatively small motor force, a comparatively large stage can be arranged to move back and forth over a comparatively large distance, e.g. 150 mm or more.

Such a magnetic force system may advantageously be applied in a positioning system for positioning a patterning device in a lithographic apparatus. In such embodiment, the magnetic force system may thus be applied for reversing the direction of a patterning device during an exposure process of a substrate. Using the positioning system according to the second aspect of the present invention, such a reversal, i.e. decelerating the stage and accelerating the stage in the opposite direction, can be achieved substantially without dissipation in a longstroke actuator.

In particular, in case the stage 520 is brought up to its desired speed, the motor 550 is only required to maintain the speed, i.e. to compensate for the frictional forces acting on the stage.

In an embodiment of the present invention, the motor 550 is further configured to control the speed of the stage 520. In case of the application of the positioning system 500 in a lithographic apparatus to drive a stage provided with a patterning device, it is advantageous to control the speed of the patterning device during the scanning of the patterning device by a radiation beam. In particular, it may be advantageous to perform the scanning of the patterning device while the patterning device is moving at a constant speed.

As such, in an embodiment of the present invention, the motor 550 as applied in the positioning system 500 for driving a stage provided with a patterning device, may be configured to control the stage to move at a substantially constant speed in a operating range defined by the required scanning range of the patterning device. Such a scanning operating range would typically be only a portion of the overall operating range of the magnetic force system, i.e. the operating range between the first and second position as indicated above.

In order to maintain a constant speed in such a scanning operating range, the motor 550 may be configured to compensate the resulting force of the magnet systems 619 and 621 in said scanning operating range.

This is schematically illustrated in FIG. 14. FIG. 14 schematically shows a force Frep as e.g. generated by magnetic force system 619, 621 of FIG. 13 in the operating range between the first position (at Y=0) and the second position (at Y=T) as described above. FIG. 13 further shows a required scanning operating range Sr, the scanning operating range being a part of the operating range. FIG. 14 further schematically shows a graph M representing the motor force that is to be generated across the scanning operating range, in order to maintain the stage 5 at a substantially constant speed during the scanning across the scanning operating range. As can be seen, the required motor force M can be substantially smaller than the required resulting repelling force Fr, required to reverse the direction of the stage, e.g. stage 520 shown in FIG. 13. FIG. 14 also schematically shows the resulting force Fr+M as acting on the stage in the scanning operating range.

As can be seen from FIG. 14, by proper design of the magnet assemblies applied, a sub-range of the operating range of the magnetic force system (i.e. between the first position at Y=0 and the second position at Y=T) can be obtained which has a comparatively low resultant repelling force Frep. As such, in order for the resulting force Frep+M to be substantially zero across said sub-range, only a small motor force would be required. Typically, the required motor force M may be 10 to 20 times smaller that the maximum repelling force that can be generated.

Using the positioning system according to the second aspect of the present invention, the dissipation of a long-stroke positioning device, e.g. for positioning a stage in a lithographic apparatus, can be reduced substantially.

As indicated above, the magnet assemblies as applied in a magnetic force system may also comprise active components such as electromagnets. Such active magnet assemblies, e.g. magnet assemblies 430 or 530 may advantageously applied in the following manner.

The active magnet assemblies may enable to speed up the start up process of the positioning system, the start up process referring to the gradual increase in speed by using the motor 550, as described above. This can be understood as follows: by controlling the current through the coil 430.1 or 530.1, one can control the amplitude of the repelling force, said force being the main cause of the stage coming to a halt and reversing direction. By controlling the current through the coil, one can obtain that the stage moves closer to the first or second position, before it comes to a halt. This enables, as can be derived from the force graph Frep, the stage to accelerate more during a subsequent move in the opposite direction. In case a magnetic force system as shown in FIG. 11 or 12 would be applied to drive the stage 520 relative to the frame 510, the following operations could be performed: It is first assumed that a force characteristic Frep as shown in FIG. 14 can be generated when a nominal current Inom is applied to the coils of the magnet assemblies, e.g. coils 430.1 or 530.1. In case the stage 5 is moving in the positive Y-direction, one could reduce the current in the magnet assembly on the right of the stage 5 and (optionally) increase the current in the magnet assembly on the left of the stage. As a result, the stage would move further to the right. When the stage reverses direction, one could increase the current in the magnet assembly on the right of the stage 5, e.g. to a value above the current Inom and decrease the current in the magnet assembly on the left of the stage to a value below the nominal current Inom. By doing so, the start up sequence can be shortened. In such embodiment, i.e. where active magnet assemblies are applied, one can, by controlling the current supplied to the coils of the active magnet assemblies, control the zero force position or the neutral position. As such, in such embodiment, there is no need to implement a separate motor 550 to drive the stage away from the neutral position, or away from the low-force region.

Active magnet assemblies, e.g. magnet assemblies 430 or 530 as shown in FIG. 11 or 12 may also advantageously be applied to control the resulting repelling force Frep. In case the resulting repelling force is determined as a function of the currents supplied to the active magnet assemblies, one can determine the appropriate currents to arrive at a substantially zero resulting force in a scanning operating range.

FIGS. 8, 10-12 schematically show basic embodiments of passive force systems and magnetic force systems as can be applied in positioning systems according to the present invention. As will be understood by the skilled person, various modifications may be applied to the basic embodiments without departing from the scope of the invention.

Such modifications may e.g. aim to increase the generated repelling or repulsive force. Such increase in the generated force may e.g. be obtained by applying additional magnets, e.g. stacked in the Z-direction, or by complementing the basis magnets as shown with so-called Halbach magnets.

Such modifications may also aim to control the shape of the resulting repelling force characteristic, e.g. characteristic Frep, in order to facilitate the control of the motor 550, when applied.

Merely as an illustration, FIG. 15 schematically shows a magnet assembly 700 as can be applied in a magnetic force system, in particular a passive magnetic force system as can be applied in a positioning system according to the present invention. FIG. 15 schematically shows a magnet assembly 700 comprising a first magnet assembly 710 and a second magnet assembly 720. In an embodiment, the first magnet assembly 710 may e.g. be mounted to a main stage, i.e. as a main stage magnet assembly, while the second magnet assembly may be mounted to a substage, e.g. as a substage magnet assembly. Alternatively, as discussed with reference to FIG. 13, the first magnet assembly 710 may e.g. be mounted to a frame, e.g. frame 510, while the second magnet assembly may be mounted to a stage, e.g. stage 520. The first magnet assembly 710 forms a magnetic circuit with two gaps 730 that are configured to receive two magnets 720.1, 720.2 of the second magnet assembly 720. The first magnet assembly 710 comprises a magnetic yoke 710.1, a first magnet set 710.2 mounted to an upper part of the magnetic yoke 710.1, a second magnet set 710.3 mounted to a lower part of the magnetic yoke 710.1, and an intermediate magnet 710.4. As can be seen, the first and second magnet sets 710.2, 710.3 have a Halbach configuration, thus enabling to increase the generated force and reducing the magnetic flux outside the magnet assembly.

Several of the magnet assemblies have been shown as a single permanent magnet (FIG. 5) and as a one dimensional array, but it is also envisaged that other configurations are used, such as two-dimensional arrays, including Halbach configurations. It is also noted that the configuration of the substage magnet assembly does not necessarily have to be equal to the configuration of the main stage magnet assembly. One of them may have a Halbach configuration and the other one may not.

It has been theoretically shown that a configuration with a one-dimensional array has the benefit that a stiffness in at least one direction substantially perpendicular to the moving direction can be minimized while maintaining a good characteristic in the moving direction.

It is further noted that features described for particular embodiments may also be beneficially applied to other embodiments and that the shown embodiments are not limited to the specific design choices. As an example, the shown embodiments are most of the time symmetric with respect to a line through the centre of gravity. Although this may be preferred, it is not required for the invention. The same applies to shown gaps that are most of the time equal due to a choice of magnets having similar characteristics. However, a system in which magnets have different characteristics leading to different gaps between magnets is also envisaged.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A positioning system comprising:
    a frame;
    a stage configured to move with respect to the frame along a moving direction between a first position and a second position;
    a magnetic force system comprising at least two magnet systems each configured to apply a repelling force to the stage in a non-contact manner and along the moving direction, wherein
        the magnetic force system is configured to apply a resultant force to the stage, based on a sum of the repelling forces, to drive the stage along the moving direction,
        a magnitude and direction of the resultant force depends on a position of the stage relative to the frame,
        the stage has a zero-force position between the first and second positions in which the resultant force has a zero magnitude,
        each magnet system comprises:
            a first magnet assembly mounted to one of the stage and the frame, the first magnet assembly comprising a first magnet; and
            a second magnet assembly mounted to the other one of the stage and the frame, the second magnet assembly comprising a magnetic circuit having a gap,
        the gap is configured to receive the first magnet based on the moving of the stage, and
        the second magnet assembly is configured to generate a magnetic flux that crosses a in the gap; and
    an electromagnetic motor or actuator configured to drive the stage along the moving direction relative to the frame.

2. The positioning system of claim 1, wherein the first magnet comprises a permanent magnet.

3. The positioning system of claim 1, wherein the magnetic circuit comprises a magnetic yoke configured to guide the magnetic flux.

4. The positioning system of claim 3, wherein the magnetic circuit comprises a second magnet for generating the magnetic flux.

5. The positioning system of claim 4, wherein the second magnet comprises a permanent magnet, an electromagnet, or the permanent magnet and the electromagnet.

6. The positioning system of claim 1, wherein the positioning system comprises the electromagnetic motor.

7. The positioning system of claim 1, wherein the resultant force has a comparatively large amplitude near the first position and near the second position and has a comparatively low amplitude across a sub-range that is a portion of a range between the first and second positions.

8. The positioning system of claim 1, wherein the two magnet systems are disposed on opposite sides of the stage and along the moving direction.

9. The positioning system of claim 6, wherein the electromagnetic motor comprises a first member mounted to the stage and a second member mounted to the frame, the first and second members being configured to generate a driving force to drive the stage along the moving direction.

10. The positioning system of claim 6, wherein the electromagnetic motor is further configured to compensate the resulting force to allow the stage to move at an approximately constant speed across a sub-range that is a portion of a range between the first and second positions.

11. A lithographic apparatus comprising:
    an illumination system configured to illuminate a pattern of a patterning device;
    a projection system configured to project an image of the pattern onto a substrate;
    a positioning system comprising:
        a frame;
        a stage configured to support the substrate or the patterning device and to move with respect to the frame along a moving direction between a first position and a second position;
        a magnetic force system comprising at least two magnet systems each configured to apply a repelling force to the stage in a non-contact manner and along the moving direction, wherein the magnetic force system is configured to apply a resultant force to the stage, based on a sum of the repelling forces, to drive the stage along the moving direction,
a magnitude and direction of the resultant force depends on a position of the stage relative to the frame,
the stage has a zero-force position between the first and second positions in which the resultant force has a zero magnitude,
each magnet system comprises:
a first magnet assembly mounted to one of the stage and the frame, the first magnet assembly comprising a first magnet; and
a second magnet assembly mounted to the other one of the stage and the frame, the second magnet assembly comprising a magnetic circuit having a gap,
the gap is configured to receive the first magnet based on the moving of the stage, and
the second magnet assembly is configured to generate a magnetic flux in the gap; and
an electromagnetic motor or actuator configured to drive the stage along the moving direction relative to the frame.

12. The lithographic apparatus of claim 11, wherein the first magnet comprises a permanent magnet.

13. The lithographic apparatus of claim 11, wherein the magnetic circuit comprises a magnetic yoke configured to guide the magnetic flux.

14. The lithographic apparatus of claim 13, wherein the magnetic circuit comprises a second magnet for generating the magnetic flux.

15. The lithographic apparatus of claim 14, wherein the second magnet comprises a permanent magnet, an electromagnet, or the permanent magnet and the electromagnet.

16. The lithographic apparatus of claim 11, wherein the positioning system comprises the electromagnetic motor.

17. The lithographic apparatus of claim 16, wherein the electromagnetic motor comprises a first member mounted to the stage and a second member mounted to the frame, the first and second members being configured to generate a driving force to drive the stage along the moving direction.

18. The lithographic apparatus of claim 16, wherein the electromagnetic motor is further configured to compensate the resulting force to allow the stage to move at an approximately constant speed across a sub-range that is a portion of a range between the first and second positions.

19. The lithographic apparatus of claim 11, wherein the resultant force has a comparatively large amplitude near the first position and near the second position and has a comparatively low amplitude across a sub-range that is a portion of a range between the first and second positions.

20. The lithographic apparatus of claim 11, wherein the two magnet systems are disposed on opposite sides of the stage and along the moving direction.

* * * * *

UNITED STATES PATENT AND TRADEMARK OFFICE
CERTIFICATE OF CORRECTION

PATENT NO. : 11,460,786 B2
APPLICATION NO. : 16/763925
DATED : October 4, 2022
INVENTOR(S) : Huang et al.

It is certified that error appears in the above-identified patent and that said Letters Patent is hereby corrected as shown below:

On the Title Page

Item (54) and in the Specification Column 1, Lines 1-3, replace "POSITIONING SYSTEM AND A METHOD FOR POSITIONING A SUBSTAGE OR A STAGE WITH RESPECT TO A FRAME" with --A POSITIONING SYSTEM AND A METHOD FOR POSITIONING A SUBSTAGE OR A STAGE WITH RESPECT TO A FRAME--.

In the Claims

In Column 23, Line 63, replace "wherein" with --wherein:--.

In Column 24, Line 18, replace "a magnetic flux that crosses a in the gap" with --a magnetic flux in the gap--.

In Column 24, Line 67, replace "wherein" with --wherein:--.

Signed and Sealed this
Fifteenth Day of November, 2022

Katherine Kelly Vidal
*Director of the United States Patent and Trademark Office*